(12) United States Patent
Mauder et al.

(10) Patent No.: US 10,516,065 B2
(45) Date of Patent: Dec. 24, 2019

(54) SEMICONDUCTOR DEVICES AND METHODS FOR FORMING SEMICONDUCTOR DEVICES

(71) Applicant: Infineon Technologies AG, Neubiberg (DE)

(72) Inventors: Anton Mauder, Kolbermoor (DE); Frank Dieter Pfirsch, Munich (DE); Hans-Joachim Schulze, Taufkirchen (DE); Philipp Seng, Munich (DE); Armin Willmeroth, Friedberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/642,893

(22) Filed: Jul. 6, 2017

(65) Prior Publication Data

US 2018/0013013 A1  Jan. 11, 2018

(30) Foreign Application Priority Data

Jul. 7, 2016 (DE) .................. 10 2016 112 490

(51) Int. Cl.
*H01L 21/00* (2006.01)
*H01L 29/00* (2006.01)
(Continued)

(52) U.S. Cl.
CPC ........ *H01L 29/8611* (2013.01); *H01L 29/063* (2013.01); *H01L 29/0615* (2013.01); *H01L 29/0619* (2013.01); *H01L 29/0623* (2013.01); *H01L 29/0688* (2013.01); *H01L 29/08* (2013.01); *H01L 29/36* (2013.01); *H01L 29/66128* (2013.01); *H01L 29/66136* (2013.01); *H01L 21/2253* (2013.01); *H01L 21/266* (2013.01); *H01L 21/2652* (2013.01); *H01L 29/1608* (2013.01); *H01L 29/2003* (2013.01)

(58) Field of Classification Search
CPC .............. H01L 21/2253; H01L 21/266; H01L 21/02598; H01L 21/28; H01L 29/8611; H01L 29/0623; H01L 29/063; H01L 29/08; H01L 29/66128; H01L 29/66136
See application file for complete search history.

(56) References Cited

U.S. PATENT DOCUMENTS

| 4,985,741 | A | * | 1/1991 | Bauer | ................. H01L 29/7395 257/133 |
| 6,624,497 | B2 | | 9/2003 | Beasom | |

(Continued)

FOREIGN PATENT DOCUMENTS

| DE | 102004042758 B4 | 8/2006 |
| DE | 102009036930 A1 | 3/2010 |
| JP | 200233479 A | 1/2002 |

*Primary Examiner* — Nikolay K Yushin
(74) *Attorney, Agent, or Firm* — Murphy, Bilak & Homiller, PLLC

(57) ABSTRACT

A semiconductor device includes an anode doping region of a diode structure arranged in a semiconductor substrate. The anode doping region has a first conductivity type. The semiconductor device further includes a second conductivity type contact doping region having a second conductivity type. The second conductivity type contact doping region is arranged at a surface of the semiconductor substrate and surrounded in the semiconductor substrate by the anode doping region. The anode doping region includes a buried non-depletable portion. At least part of the buried non-depletable portion is located below the second conductivity type contact doping region in the semiconductor substrate.

18 Claims, 9 Drawing Sheets

(51) Int. Cl.
  *H01L 29/861* (2006.01)
  *H01L 29/06* (2006.01)
  *H01L 29/08* (2006.01)
  *H01L 29/66* (2006.01)
  *H01L 29/36* (2006.01)
  *H01L 21/225* (2006.01)
  *H01L 21/266* (2006.01)
  *H01L 29/16* (2006.01)
  *H01L 29/20* (2006.01)
  *H01L 21/265* (2006.01)

(56) References Cited

U.S. PATENT DOCUMENTS

| | | | |
|---|---|---|---|
| 7,135,349 B2 * | 11/2006 | Maeng | H01L 27/1443 438/48 |
| 7,195,965 B2 * | 3/2007 | Lin | H01L 29/0615 257/E21.346 |
| 7,368,359 B2 * | 5/2008 | Kishima | H01L 21/76243 257/E21.17 |
| 7,492,034 B2 | 2/2009 | Pfirsch | |
| 8,415,747 B2 | 4/2013 | Eckel et al. | |
| 9,553,179 B2 * | 1/2017 | Vellei | H01L 29/7397 |
| 2004/0079991 A1 * | 4/2004 | Lin | H01L 29/0615 257/335 |
| 2005/0118743 A1 * | 6/2005 | Maeng | H01L 27/1443 438/57 |
| 2006/0154415 A1 * | 7/2006 | Kishima | H01L 21/76243 438/232 |
| 2010/0200936 A1 | 8/2010 | Saito et al. | |
| 2015/0144966 A1 | 5/2015 | Konrath et al. | |
| 2015/0221756 A1 * | 8/2015 | Vellei | H01L 29/7397 257/139 |
| 2016/0181442 A1 | 6/2016 | Higashida | |

\* cited by examiner

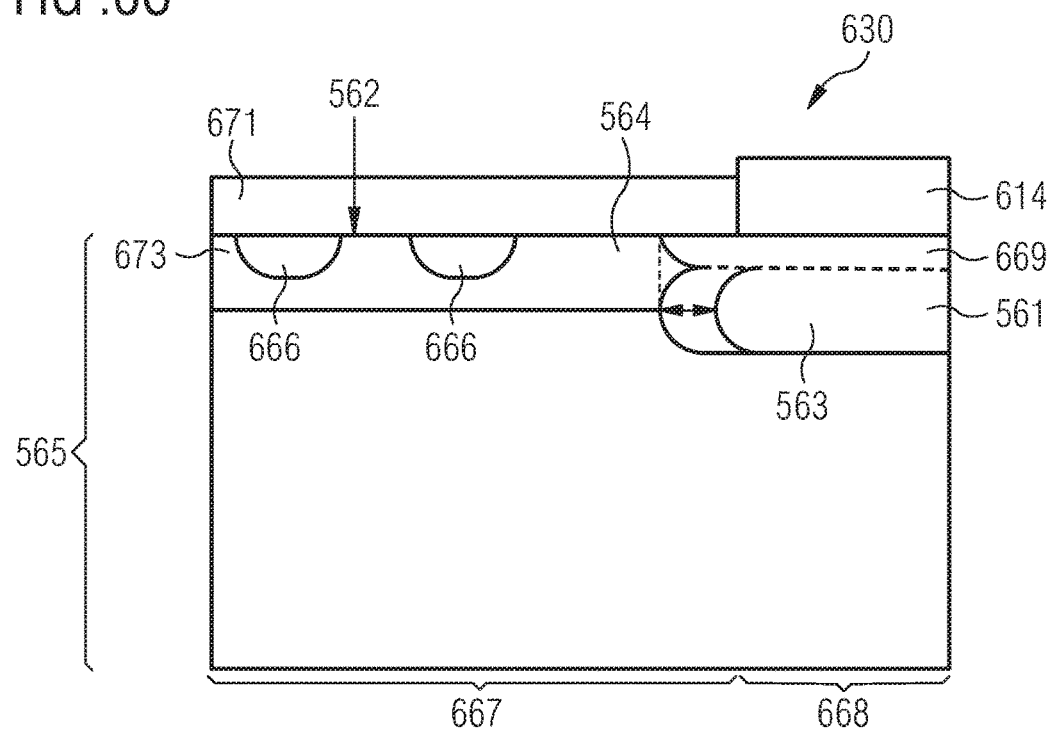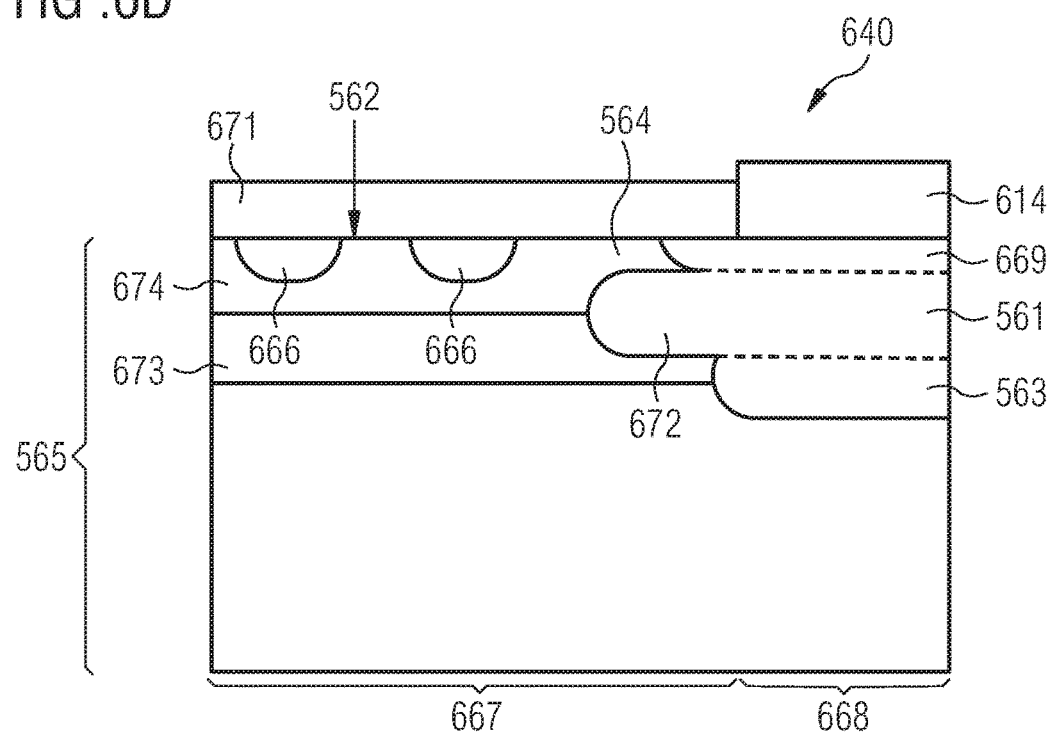

SEMICONDUCTOR DEVICES AND METHODS FOR FORMING SEMICONDUCTOR DEVICES

TECHNICAL FIELD

Embodiments relate to concepts for semiconductor device structures, and in particular to semiconductor devices, and methods for forming semiconductor devices.

BACKGROUND

In semiconductor devices (e.g. diodes or freewheeling diodes), the semiconductor volume needed to sustain a blocking voltage in reverse operation is flooded with charge carriers during forward operation leading to low forward losses of the device. During commutation of the device, which is the change from a forward operation mode to a blocking operation mode by the external circuit, these carriers have to be removed. Weakly doped anode regions implemented in diodes may lead to poor resistance to surge currents. Highly doped anode regions with damage implantation implemented in diodes, may suffer from increased leakage current or hot leakage current, and may be unsuitable for shrinkage of the devices.

SUMMARY

It is a demand to provide concepts for semiconductor devices with improved robustness and/or improved resistance to surge currents while maintaining low commutation losses.

Such a demand may be satisfied by the subject matter of the claims.

Some embodiments relate to a semiconductor device. The semiconductor device comprises an anode doping region of a diode structure arranged in a semiconductor substrate. The anode doping region comprises a first conductivity type. The semiconductor device further comprises a second conductivity type contact doping region comprising a second conductivity type. The second conductivity type contact doping region is arranged at a surface of the semiconductor substrate and surrounded in the semiconductor substrate by the anode doping region. The anode doping region comprises a buried non-depletable portion. At least part of the buried non-depletable portion is located below the second conductivity type contact doping region in the semiconductor substrate. The buried non-depletable portion is completely surrounded by semiconductor material of the semiconductor substrate.

Some embodiments relate to a method for forming a semiconductor device. The method comprises incorporating dopants into a semiconductor substrate through a decelerating mask layer arranged at a surface of the semiconductor substrate, to simultaneously form at least one first conductivity type contact doping portion of an anode doping region located at the surface of the semiconductor substrate at a masked region of the semiconductor substrate and at least one buried non-depletable portion of the anode doping region located in the semiconductor substrate at unmasked regions of the semiconductor substrate.

Some embodiments relate to a diode device. The diode device comprises an anode doping region arranged in a semiconductor substrate. The anode doping region comprises a first conductivity type. The diode device further comprises a second conductivity type contact doping region comprising a second conductivity type. The second conductivity type contact doping region is arranged at a surface of the semiconductor substrate and surrounded by the anode doping region. The anode doping region comprises a buried non-depletable portion. At least part of the buried non-depletable portion is located below the second conductivity type contact doping region in the semiconductor substrate.

Some embodiments relate to a semiconductor device. The semiconductor device comprises an anode doping region comprising a first conductivity type arranged at a surface of a semiconductor substrate. The anode doping region comprises a buried laterally extending portion. The semiconductor device further comprises a second conductivity type doping region comprising the second conductivity type arranged vertically between the surface of the semiconductor substrate and the buried laterally extending portion of the anode region. An aspect ratio between a maximum lateral dimension of the anode doping region and a maximum vertical dimension of the anode region is at least 5:1.

Some embodiments relate to a method for forming a semiconductor device. The method comprises incorporating, by a first incorporation process, dopants of a first conductivity type to form a first doping area of an anode doping region to be formed in proximity to a surface of a semiconductor substrate. The method further comprises forming an epitaxial layer on the surface of the semiconductor substrate. The method further comprises incorporating, by a second incorporation process, dopants of the first conductivity type to form a second doping area of the anode doping region in proximity to a surface of the epitaxial layer. A dopant concentration of the dopants incorporated into the second doping area is larger than a dopant concentration of dopants of the second conductivity type in the epitaxial layer. A vertical dimension of the second doping area is smaller than a vertical dimension of the epitaxial layer. The method further comprises annealing the semiconductor substrate and the epitaxial layer to enlarge the first doping area and the second doping area due to diffusion of dopants to form a merged anode doping region extending from the surface of the epitaxial layer vertically deeper than the first doping area. An aspect ratio between a maximum lateral dimension of the anode doping region and a maximum vertical dimension of the anode doping region is at least 5:1.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 6C shows a schematic illustration of a further semiconductor device comprising a buried laterally extending portion;

FIG. 6D shows a schematic illustration of a semiconductor device comprising a plurality of buried laterally extending portions;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the all to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
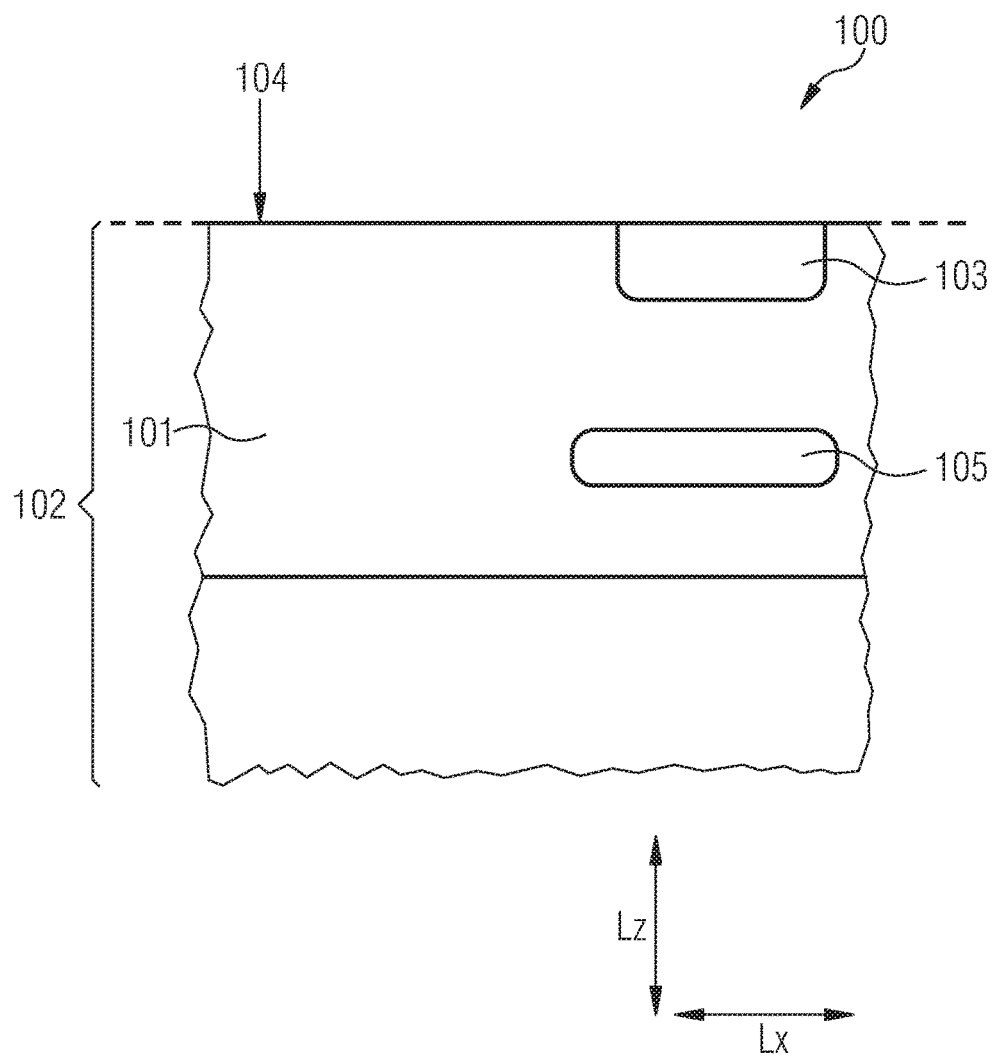
FIG. 1 shows a schematic illustration of a semiconductor device.

FIG. 1 shows a schematic illustration of a semiconductor device 100 according to an embodiment.

The semiconductor device 100 comprises an anode doping region 101 of a diode structure arranged in a semiconductor substrate 102. The anode doping region 101 comprises a first conductivity type. The semiconductor device 100 further comprises a second conductivity type contact doping region 103 comprising a second conductivity type. The second conductivity type contact doping region 103 is arranged at a surface 104 of the semiconductor substrate 102 and surrounded by the anode doping region 101. The anode doping region 101 comprises a buried non-depletable portion 105. At least part of the buried non-depletable portion 105 is located below the second conductivity type contact doping region 103 in the semiconductor substrate 102. The buried non-depletable portion 105 is completely surrounded by semiconductor material of the semiconductor substrate 102.

Due to the second conductivity type contact doping region 103 being arranged at a surface 104 of the semiconductor substrate 102, charge carriers (e.g. electrons) may flow through the second conductivity type contact doping region 103 to an anode electrode structure in the forward bias operation. These charge carriers (e.g. electrons) flowing through the second conductivity type contact doping region do not lead to injection of holes. Thus, lower flooding charge in front of the anode, in comparison to the region in front of the cathode, may lead to a smoother switching behavior of the diode structure. With increasing current densities, the density of electron currents may also increase and therefore, also the path voltage drop of the electrons on the way to the second conductivity type contact doping region 103. More holes may be injected, which may lead to an increase in the carrier flooding in a drift region, and to a limited increase of the forward voltage of the diode and diode losses. The semiconductor device 100 is therefore able to combine a low carrier flooding in front of the anode with a higher robustness and surge current strength. The semiconductor device 100 is more surge current resistant than other anode structures with the same carrier flooding at normal forward currents, for example. At high currents like e.g. at a surge current pulse, the proposed structure may have higher current flooding leading to an improved surge current strength. Due to the buried non-depletable portion 105 of the anode doping region 101 being located below the second conductivity type contact doping region 103 in the semiconductor substrate 102, the buried non-depletable portion 105 shields out an electric field to the anode contact, for example.

The anode doping region 101 comprises the buried non-depletable portion 105 having the first conductivity type. The buried non-depletable portion 105 of the anode doping region 101 may comprise (or have) a dopant concentration which is non-depletable by voltages applied to the semiconductor device 100 during a blocking operation, for example. A blocking operation may refer to a voltage (or a range of voltages) applied to the semiconductor device 100 which are outside a normal operation voltage range of the semiconductor device 100.

A maximum dopant concentration of the buried non-depletable portion 105 may be at least $5*10^{17}$ dopants per $cm^3$ (or e.g. at least $1*10^{18}$ dopants per $cm^3$, or e.g. at least $1*10^{19}$ dopants per cm$^3$). The maximum dopant concentration of the buried non-depletable portion 105 may be a largest measured number of dopants per volume over the buried non-depletable portion 105, for example. An integrated doping dose of the buried non-depletable portion 105 in a vertical direction may be larger than $2*10^{12}$ dopants per cm$^2$ for a silicon substrate or $2*10^{13}$ dopants per cm$^2$ for a silicon carbide substrate.

At least part of the buried non-depletable portion 105 is located below the second conductivity type contact doping region 103 in the semiconductor substrate 102 in a cross section of the semiconductor device. For example, the buried non-depletable portion 105 may be located closer to an opposite back surface of the semiconductor substrate 102 than the second conductivity type contact doping region 103. The buried non-depletable portion 105 may be located deeper in the semiconductor substrate than the second conductivity type contact doping region 103, for example. The buried non-depletable portion 105 may laterally overlap the whole (or e.g. more than 80%, or e.g. more than 90%, or e.g. at least partially overlap) of the second conductivity type contact doping region 103 in a top view of the semiconductor device 100. For example, the buried non-depletable portion 105 may have a larger lateral area of larger maximum or average) lateral dimension than a (maximum or average) lateral dimension of the second conductivity type contact doping region 103 in a top view of the semiconductor device 100.

A maximum (or largest) lateral width (in a first lateral direction Lx) of the buried non-depletable portion 105 of the anode doping region 101 may be less than 5 μm (or e.g. less than 2 μm, or e.g. less than 1 μm), for example. Optionally, a maximum (or largest) lateral width of the buried non-depletable portion 105 may be more than 5% (or e.g. more than 10%, or e.g. more than 20%) larger than a maximum (or largest) lateral width of the second conductivity type contact doping region 103, for example.

An average or maximum vertical dimension in the vertical direction, Lz, (e.g. a height) of a (or each) buried non-depletable portion may lie between 100 nm and 500 nm, (or e.g. between 200 nm and 400 nm), for example.

A minimum (or smallest) vertical distance (or separation) between the buried non-depletable portion 105 and the second conductivity type contact doping region 103 may be at least than 1 μm (or e.g. at least 2 μm, or e.g. at least than 5 μm).

The buried non-depletable portion 105 is completely surrounded by semiconductor material of the semiconductor substrate 102. For example, the buried non-depletable portion 105 is not connected directly to any electrode structures (e.g. an anode electrode structure or e.g. a cathode electrode structure) at the surface of the semiconductor substrate 102. Optionally, the buried non-depletable portion 105 of the anode doping region 101 may be embedded in (e.g. substantially or wholly buried in, or e.g. substantially or wholly surrounded by) the depletable portion of the anode doping region 101. Optionally, additionally or alternatively, the buried non-depletable portion 105 may be at least partially (or completely) surrounded by a buried recombination region of the anode doping region 101. The recombination region might not span into the area between the buried non-depletable portion 105 and the drift region below the anode doping region 101. Otherwise the leakage current may increase in blocking operation. Optionally, additionally or alternatively, the buried recombination region of the anode doping region 101 may at least partially penetrate into the buried non-depletable portion 105. Optionally, additionally or alternatively, the buried non-depletable portion 105 may be partially surrounded by one or more doping regions (e.g. a depletable portion, a buried recombination region, or a contact doping portion) of the semiconductor substrate 102.

The second conductivity type contact doping region 103 is located at the surface 104 of the semiconductor substrate 102. For example, the second conductivity type contact doping region 103 may be located at the first surface 104 (or front surface) of the semiconductor substrate 102.

The second conductivity type contact doping region 103 is surrounded in the semiconductor substrate 102 by the anode doping region 101. For example, the anode doping region 101 may be formed around (e.g. directly adjacently to) the second conductivity type contact doping region 103 in the semiconductor substrate 102. For example, the anode doping region 101 may be formed laterally around and/or at the bottom of the second conductivity type contact doping region 103 in the semiconductor substrate 102.

An average dopant concentration of the second conductivity type contact doping region 103 may be at least $1*10^{16}$ dopants per cm$^3$ (or e.g. at least $1*10^{17}$ dopants per cm$^3$, or e.g. at least $1*10^{18}$ dopants per cm$^3$). The average dopant concentration of the second conductivity type contact doping region 103 may be a measured number of dopants per volume averaged over the second conductivity type contact doping region 103, for example.

An average or maximum height in the vertical direction, Lz, of the second conductivity type contact doping region 103 may lie between 100 nm and 500 nm, (or e.g. between 200 nm and 400 nm), for example.

The anode doping region 101 may further include a first conductivity type contact doping portion located laterally adjacently to the second conductivity type contact doping region 103 at the surface 104 of the semiconductor substrate 102. A dopant concentration of the buried non-depletable portion 105 of the anode doping region 101 may be higher than (e.g. at least 10 times, or e.g. at least 100 times higher than) a dopant concentration of the first conductivity type contact doping portion of the anode doping region 101.

An average dopant concentration of the first conductivity type contact doping portion of the anode doping region 101 may be at least $1*10^{16}$ dopants per cm$^3$ (or e.g. at least $1*10^{17}$ dopants per cm$^3$, or e.g. at least $1*10^{18}$ dopants per cm$^3$). The average dopant concentration of the first conductivity type contact doping portion may be a measured number of dopants per volume averaged over the first conductivity type contact doping portion, for example.

An average or maximum (vertical) height in the vertical direction, Lz, of the first conductivity type contact doping portion may lie between 100 nm and 500 nm, (or e.g. between 200 nm and 400 nm), for example. Optionally, the height of the second conductivity type contact doping region 103 may be smaller, the same or bigger than the first conductivity type contact doping portion of the anode doping region 101.

The anode doping region 101 may further include a depletable portion. The depletable portion of the anode doping region 101 may surround the buried non-depletable portion 105 in the semiconductor substrate 102. For example, the buried non-depletable portion 105 of the anode doping region 101 may be embedded in (e.g. substantially or wholly buried in, or e.g. substantially or wholly surrounded by) the depletable portion of the anode doping region 101.

At least part of the depletable portion of the anode doping region 101 may be located between the buried non-depletable portion 105 of the anode doping region 101 and an anode electrode structure located at or on the surface 104 of the semiconductor substrate 102. Thus, the buried non-depletable portion 105 is not directly connected to an electrode structure, for example. At least part of the depletable portion of the anode doping region 101 may be located between the buried non-depletable portion 105 of the anode doping region 101 and the first conductivity type contact doping portion at the surface 104 of the semiconductor substrate 102. Additionally or optionally. At least part of the depletable portion of the anode doping region 101 may be located between the buried non-depletable portion 105 of the anode doping region 101 and the second conductivity type contact doping region 103 at the surface 104 of the semiconductor substrate 102. For example, at least part of the depletable doping portion of the anode doping region 101 may be located below (or deeper in the semiconductor substrate 102 than) the second conductivity type contact doping region 103 and the first conductivity type contact doping portion of the anode doping region 101, for example.

Optionally, the depletable portion of the anode doping region 101 may be (or include) a field stop doping portion of the anode doping region 101.

A (maximum or average) dopant concentration of the buried non-depletable portion 105 of the anode doping region 101 may be larger (e.g. at least five times larger, or e.g. at least 10 times larger, or e.g. at least 100 times larger) than a (maximum or average) dopant concentration of the depletable portion of the anode doping region 101, for example. Additionally or optionally, a (maximum or average) dopant concentration of the buried non-depletable portion 105 of the anode doping region 101 may be larger (e.g. at least five times larger, or e.g. at least 10 times larger, or e.g. at least 100 times larger) than a (maximum or average) dopant concentration of the field stop doping portion of the anode doping region 101, for example.

An average dopant concentration of the depletable portion may be at least $1*10^{16}$ dopants per cm$^3$ (or e.g. at least $1*1.0^{17}$ dopants per cm$^3$, or e.g. at least $1*10^{18}$ dopants per cm$^3$). The average dopant concentration of the depletable portion may be a measured number of dopants per volume averaged over the depletable portion, for example.

Optionally, at least part of the depletable portion of the anode doping region 101 may be located between the buried non-depletable portion 105 of the anode doping region 101 and the drift region of the diode structure. An average dopant concentration of the drift region may be at least $1*10^{12}$ dopants per cm$^3$ (or e.g. at least $1*10^{13}$ dopants per cm$^3$, or e.g. at least $1*10^{14}$ dopants per cm$^3$, or e.g. at least $1*10^{15}$ dopants per cm$^3$). The average dopant concentration of the drift region may be a measured number of dopants per volume averaged over the drift region, for example.

The anode doping region 101 may optionally further include the buried recombination portion. The buried recombination portion may be embedded in (e.g. substantially or wholly buried in or e.g. substantially or wholly surrounded by) the depletable doping portion (e.g. which may be a field stop doping portion). Optionally, the buried recombination portion of the anode doping region 101 may be located between at least part of the depletable doping portion and the first surface 104 of the semiconductor substrate 102. For example, sufficient doping of the anode may be located between the recombination portion and the drift zone. The electric field may be stopped before it reaches the recombination portion. In contrast, the recombination portion may reach one or more of the first surface 104, the contact doping region 103 and the anode p contact doping region, for example.

For example, the recombination region might be not deeper (or not substantially deeper) than the non-depletable region 105.

The buried recombination portion may include (or may have) a higher average concentration of recombination centers than the drift region of the diode structure. The recombination centers may be (or may include) crystal defects and/or heavy metal doping for example.

Optionally, at least part of the buried recombination portion may be located under and/or at least partially in the p-doped (first conductivity type) contact region, which may make a further control option for the injection of the region. For example, with a very good ohmic contact, a relatively low charge carrier injection of the region may be realized. If the buried recombination region ends in the depth above the buried (non-depletable) anode region (or at least above the doping maximum), a reverse current increase through the buried recombination region may be avoided, for example. For example, if some field stop lying vertically between the non-depletable portion 105 and the drift region, the buried recombination portion may even exceed the depth of the non-depletable portion 105.

The second conductivity type contact doping region 103 may include donor dopants causing the second conductivity type. For example, the donor dopants may be the most active dopants and/or the majority of dopants causing the second conductivity type of the second conductivity type contact doping region 103. The donor dopants may include selenium, phosphorus, arsenic, antimony and/or bismuth, for example. For example, the second conductivity type contact doping region 103 (the n-type contact) may be a selenium (or e.g. phosphorus, or e.g. arsenic, or e.g. antimony or e.g. bismuth) doped contact. With a selenium doping (or a doping by the donor dopants), an ohmic contact may be produced which does not act as an emitter. For example, an ohmic selenium contact to silicon may further avoid the risk that a high hole current density overcoming the diffusion barrier of the p-n junction to the (n-type) contact in the flow direction (during commutating of the diode, by avalanche breakdown or by a cosmic radiation event) leading to an uncontrolled injection of electrons by the second conductivity type contact doping region 103, for example.

According to another example, phosphorus atoms may be implanted close to the surface with a dose of at least (e.g. greater than or equal to) $4*10^{14}$ dopants per cm$^2$ or e.g. at least $1*10^{15}$ dopants per cm$^2$ which are not completely annealed (e.g. annealing with temperatures of less than 500° C. or less than 450° C.), or after an annealing step, may be disturbed again in the crystal structure through implantation of non-doping particles (e.g. Silicon Si, germanium Ge, argon Ar, helium He, neon Ne, and/or Xenon Xe). Optionally, selenium and phosphorus atoms may be implanted.

The anode doping region 101 (e.g. including the depletable portion, the first conductivity type contact doping portion, and optionally the field stop doping portion and/or the buried recombination portion) is part of a diode structure.

The anode doping region and the second conductivity type contact doping region may be electrically connected to an anode electrode structure (e.g. an anode metal) located at the first surface 104 of the semiconductor substrate 102. For example, the anode electrode structure may be arranged (directly) adjacently to the first conductivity type contact doping portion of the anode doping region 101 and the second conductivity type contact doping region at the first surface 104 of the semiconductor substrate 102, for example. The anode electrode structure may include one or more electrically conductive layers (e.g. metallization layers and/or barrier layers) electrically connected (e.g. ohmically connected) to the anode doping region and the second conductivity type contact doping region, for example.

At least part of the drift region may be located adjacently (e.g. directly adjacently) to the depletable portion (or e.g. the field stop doping portion) of the anode doping region 101. For example, at least part of the drift region may be located between the depletable portion of the anode doping region 101 and a cathode doping region.

At least a portion of the anode doping region 101 may be located between the second conductivity type contact doping region 103 and the drift region. For example, the buried non-depletable portion 105 of the anode doping region 101 and/or at least part of the depletable portion of the anode doping region 101 may be located between the second conductivity type contact doping region 103 and the drift region, for example.

The drift region may have a doping concentration of dopants of the second conductivity type which may be constant or which may vary in a vertical direction. For example, the doping concentration of the drift region adjacent to the anode doping region 101 may be lower than in a portion of the drift region deeper in the semiconductor substrate 102.

The diode structure may further include a cathode (contact) doping region comprising (or having) the second conductivity type, for example. The cathode doping region may be arranged at a second surface (opposite to the first surface, e.g. a back surface) of the semiconductor substrate 102, for example. The cathode doping region may be located at (e.g. directly adjacent to) the second surface of the semiconductor substrate 102. The cathode doping region may be located between the drift region and the second surface of the semiconductor substrate 102, for example.

The cathode doping region may be electrically connected to a cathode electrode structure located at (or on) the second (opposite) surface of the semiconductor substrate 102. For example, the cathode electrode structure may be arranged (directly) adjacently to the cathode doping region, for example. The cathode electrode structure may include one or more electrically conductive layers (e.g. metallization layers and/or barrier layers) electrically connected (e.g. ohmically connected) to the cathode doping region, for example.

Optionally, an aspect ratio between a maximum (or average) lateral dimension of the buried non-depletable portion 105 doping region and a maximum (or average) vertical dimension of the buried non-depletable portion 105 may be at least 5:1 (or e.g. at least 7:1, or e.g. at least 10:1, or e.g. at least 15:1), for example.

A maximum vertical dimension (height) of the anode doping region 101 in the vertical direction, Lz, may lie between 100 nm and 20 µm, (or e.g. between 500 nm and 10 µm, or e.g. between 1 µm and 5 µm), for example. The maximum vertical dimension of the anode region 101 may be a largest height of the anode region 101 between the first surface 104 of the semiconductor substrate 102 and the cathode doping region.

A maximum lateral width of the buried non-depletable portion 105 in the lateral direction, Lx, may lie between 1 µm and 5 µm (or e.g. between 2 µm and 4 µm, or e.g. between 2 µm and 3 µm), for example.

Optionally, the anode doping region 101 may be one of a plurality of (similar or substantially identical) anode doping regions 101 of the diode structure. Optionally, the cathode doping region may be one of a plurality of (similar or substantially identical) cathode doping regions of the diode structure. Optionally the second conductivity type contact doping region 103 may be one of a plurality of (similar or substantially identical) second conductivity type contact doping regions. Optionally the first conductivity type contact doping region may be one of a plurality of (similar or substantially identical) first conductivity type contact doping regions For example, anode 101 and cathode are areas covering almost the whole chip area of the diode while the contact regions and the not-depletable region 105 are structured.

Optionally, a or (each) second conductivity type contact doping region 103 may be located (laterally) between two (consecutive, or successive) first conductivity type contact doping portions of the anode doping region 101 at the first surface 104 of the semiconductor substrate 102, for example. A maximum (or largest) lateral width of the second conductivity type contact doping region (at the surface 104 of the semiconductor substrate 102) between the two first conductivity type contact doping portions of the anode doping region 101 may be less than 5 µm (or e.g. less than 2 µm, or e.g. less than 1 µm), for example.

The first conductivity type contact doping portion of a anode doping region 101 may be located between two (consecutive, or successive) second conductivity type contact doping regions located at the first surface 104 of the semiconductor substrate 102, for example. A maximum (or largest) lateral width of the first conductivity type contact doping portion (at the surface 104 of the semiconductor substrate 102) between the two second conductivity type contact doping regions may be less than 5 µm (or e.g. less than 2 µm, or e.g. less than 1 µm), for example.

The first conductivity type contact doping portion and the second conductivity type contact doping region 103 (or plurality of second conductivity type contact doping regions 103) may be located in an active (or cell) region of the semiconductor substrate 102. The active region may be laterally surrounded by an edge termination region. For example, the edge termination region may be a ring shaped portion of the semiconductor substrate 102 circumferentially surrounding the cell region of the semiconductor substrate 102 in a top view of the semiconductor device 100. The edge termination region may extend from an edge of the semiconductor substrate of the semiconductor device 100 (e.g. a semiconductor die) laterally towards the active (cell) region. The edge termination region may comprise a lateral width (or thickness) measured from an edge (e.g. a vertical edge) of the semiconductor substrate 102 towards the active region depending on a blocking voltage VBR (e.g. width [µm] is equal to roughly 0.25 . . . 0.5*VBR [V], for example, less than 3500 µm and more than 50 µm (or less than 1000 µm and more than 100 µm), for example.

Optionally, the first conductivity type contact doping portion and the second conductivity type contact doping region 103 may be located in a semiconductor layer formed at (or e.g. located at) the first surface 104 of the semiconductor substrate 102. For example, the semiconductor layer may be an epitaxial layer located at the first surface of the semiconductor substrate 102, for example.

The semiconductor device 100 may further include at least one (e.g. one, or e.g. a plurality of) edge doping regions (as shown in any of FIGS. 6A to 6E) comprising (or having) the first conductivity type arranged in the edge termination region of the semiconductor substrate 102. An average dopant concentration of the one or more edge doping regions may be at least $1*10^{18}$ dopants per $cm^3$ (or e.g. at least $1*10^{19}$ dopants per $cm^3$, or e.g. at least $1*10^{20}$ dopants per $cm^3$). The average dopant concentration of the one or more edge doping regions may be a measured number of dopants per volume averaged over the one or more edge doping regions, for example. Optionally, the one or more edge doping regions may be non-depletable doping regions.

The one or more edge doping regions may be located at a substantially similar (or substantially identical) vertical level (or vertical depth) in the semiconductor substrate 102 as each other. The one or more edge doping regions may be laterally separated from each other in (or by) the edge termination region of the semiconductor substrate 102. For example, portions of the edge termination region may be located between neighboring edge doping regions, for example.

Optionally, at least one edge doping region of the one or more edge doping regions may be arranged laterally adjacently to the first conductivity type contact doping portion of the anode doping region 101 located in the active region of the semiconductor substrate, for example. Optionally, the one or more edge doping regions may be located at a substantially similar (or substantially identical) vertical level (or vertical depth) in the semiconductor substrate as the first conductivity type contact doping portion of the anode doping region 101. For example, the first conductivity type contact doping portion of the anode doping region 101 may vertically overlap more than 20% (or e.g. more than 50%, or e.g. more than 90%) of the at least one edge doping region.

The buried highly doped (p-type) edge doping regions may be selectively used as a collector for holes and for the rapid transport of holes. In particular, the effect may be used in the edge regions in which one or more buried p-type regions (e.g. edge doping regions) may be strung or arranged (like a string of pearls) from the anode doping region (e.g. the first conductivity contact doping portion of the anode doping region) to at least a certain width of the edge termination region. These p-type edge doping regions are electrically connected to each other, if at all, through low-depletable p-doping, and operate in the conductive operation not as an efficient emitter in the edge region.

During commutating of the diode structure, the (p-type) edge doping regions may collect the flowing holes efficiently, which may lead to a rapid depletion of the edge termination region. The edge termination may thus accommodate higher blocking voltages due to the rapid depletion of the edge termination region. The voltage increase may be limited through the active region of the diode and the edge termination region is not overloaded, for example. If the edge is completely depleted earlier, the current chopping over the vertical design of the active region may be adjusted in accordance with the required commutating performance.

The buried non-depletable portion 105 of the anode doping region 101, the first conductivity type contact doping portion of the anode doping region 101 and the second conductivity type contact doping region 103 may have a stripe-shape, a polygon shape, or a hexagonal shape in a top view of the semiconductor device 100. A stripe-shape may be a geometry extending in a second lateral direction significantly farther than in an orthogonal first lateral direction, Lx. For example, a stripe-shaped region may comprise a lateral length of more than 100× (or more than 500× or more than 1000×) a lateral width of the stripe-shaped regions. The lateral length of the stripe-shaped region may be the largest extension along the front (first) surface 104 of the semiconductor substrate 102 and a lateral width (e.g. between 1 µm and 5 µm or between 2 µm and 3 µm) of the stripe-shaped region may be a shortest dimension of the stripe-shaped region along the first surface 104 of the semiconductor substrate 102, for example.

The semiconductor substrate 103 may be a silicon-based semiconductor substrate (e.g. a silicon substrate, such as a float zone silicon substrate or a Czochralski silicon substrate) or a silicon carbide (SiC)-based semiconductor substrate. Alternatively, or optionally, the semiconductor substrate 103 may be a gallium arsenide (GaAs)-based semiconductor substrate, or a gallium nitride (GaN)-based semiconductor substrate, for example.

The semiconductor device may be a diode (e.g. a diode device, or e.g. a power diode), for example. The semiconductor device may be a power semiconductor device. For example, the diode structure may have a blocking voltage of at least 10 V. For example, the diode structure may have a breakdown voltage or blocking voltage of at least 100V (e.g. a breakdown voltage of more than 100V, 200 V, 300 V, 400V or 500V) or more than 500 V (e.g. a breakdown voltage of 600 V, 700 V, 800V or 1.000V) or more than 1000 V (e.g. a breakdown voltage of 1200 V, 1500 V, 1700V, 2000V, 3300V or 6500V), for example.

A region comprising the first conductivity type may be a p-doped region (e.g. caused by incorporating aluminum ions or boron ions) or an n-doped region (e.g. caused by incorporating nitrogen ions, phosphor ions, selenium ions or arsenic ions). Consequently, the second conductivity type indicates an opposite n-doped region or p-doped region. In other words, the first conductivity type may indicate a p-doping and the second conductivity type may indicate an n-doping or vice-versa.

A first lateral surface or front surface 104 of the semiconductor substrate 102 may be a surface of the semiconductor substrate 102 towards metal layers, insulation layers and/or passivation layers on top of the semiconductor substrate 102 or a surface of one of these layers. For example, a semiconductor substrate 102 front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side.

A lateral surface of the semiconductor substrate 102 may be a substantially even plane (e.g. neglecting unevenness of the semiconductor structure due to the manufacturing process and trenches). For example, the lateral dimension of the lateral surface of the semiconductor substrate 102 may be more than 100 times larger (or more than 1000 tunes or more than 10000 times) than a maximal height of structures on the main surface. In comparison to a basically vertical edge (e.g. resulting from separating the substrate of the chip from others) of the semiconductor substrate 102, the lateral surface may be a basically horizontal surface extending laterally. The lateral dimension of the lateral surface of the semiconductor substrate 102 may be more than 100 times larger (or more than 1000 times or more than 10000 times) than a basically vertical edge of the semiconductor substrate 102, for example.

The various examples described herein may avoid the problems associated with lower doped anode regions and Self-adjusting P Emitter Efficiency Diode SPEED diodes, for example. The various examples may relate to a semiconductor device 100 having a diode structure with lower charge saturation (or flooding) in front of the anode with a high robustness and surge current resistance as described in connection with FIG. 1.

In semiconductor devices (e.g. diodes or freewheeling diodes), the semiconductor volume needed to sustain a blocking voltage in reverse operation is flooded with charge carriers during forward operation leading to low forward losses of the device. During commutation of the device, which is the change from a forward operation mode to a blocking operation mode by the external circuit, these carriers have to be removed. With freewheeling diodes, it may be desired that carrier flooding near the anode in the forward operation is not too high, so that during commutating the peak reverse recovery current is not too high and the commutating losses may be minimized, for example. Furthermore, lower flooding charges in front of the anode in comparison to the region in front of the cathode may lead to a smooth commutating behavior of the diode, for example. For this purpose, a smaller (p) emitter efficiency of the anode may be required, and may be realized through a lower dopant dose of the anode region. However, for greater robustness of the diode during commutating with high current steepness and/or for high surge current resistance, a higher anode dopant dose may be needed.

In order to minimize the losses during commutation it is beneficial to have a lower concentration of these charge carriers close to the anode of the semiconductor device than close to the cathode which may be supported by a weak emitter efficiency of the anode emitter, e. g. using low doping concentrations in the anode regions. On the other hand, high doping concentrations in the anode may support or improve the ruggedness of the semiconductor device during hard commutation with high current slopes and during a surge current, i.e. very high forward current pulse stressing the semiconductor device.

By using weakly (or lowly) doped anodes to adjust the carrier density in front of the anode in normal operation, the carrier saturation may be prevented from increasing in the case of very high current flow (e.g. during surge currents). This may lead to the voltage drop over the diode rising significantly and the diode being destroyed at lower currents, like a diode with a highly doped emitter. SPEED diodes may be used to reduce or eliminate these effects. However, SPEED diodes are not easily reproducible as the laterally neighboring highly doped regions and lower doped anode regions are complex to reproduce. The parameter variations of the SPEED diodes may therefore be too large. Highly doped anodes with subsequent irradiation (e.g. damage implantation) may be used to produce an emitter with a desired behavior. However, an increased leakage current and in particular increased hot leakage current may be obtained, which may be unsuitable for further shrinkage and increasing chip temperatures.

The various examples described herein may improve the surge current resistance of diodes while at the same time largely retain the further electric characteristics through a combination of a p-type doped portion which may (predominantly) inject holes in surge current cases with a p-doped contact doping portion (e.g. the first conductivity type contact doping portion) bordering the semiconductor first surface, and an n-doped contact region (e.g. the second conductivity type contact doping portion) which functions as an electron extract zone and which borders the semiconductor surface.

For a high robustness of the diode, the buried anode region (e.g. the buried non-depletable portion) may overlap the n-type doped contact zone. Optionally, the depth of the n-type doped contact zone may be smaller, the same or bigger than the p-type doped contact zone. The arrangement of the n-type doped contact zones, the p-type doped contact zones, and the buried anode regions, may be of a regular structure (e.g. stripes, polygons, or other geometric forms).

The implantations regions for the p-doped contact zones and the buried anode regions may be located substantially complementarily from each other. For example, the p-doped contact zones and the buried anode regions may be arranged laterally alternatingly in the top view of the semiconductor substrate 102.

Figure 2:
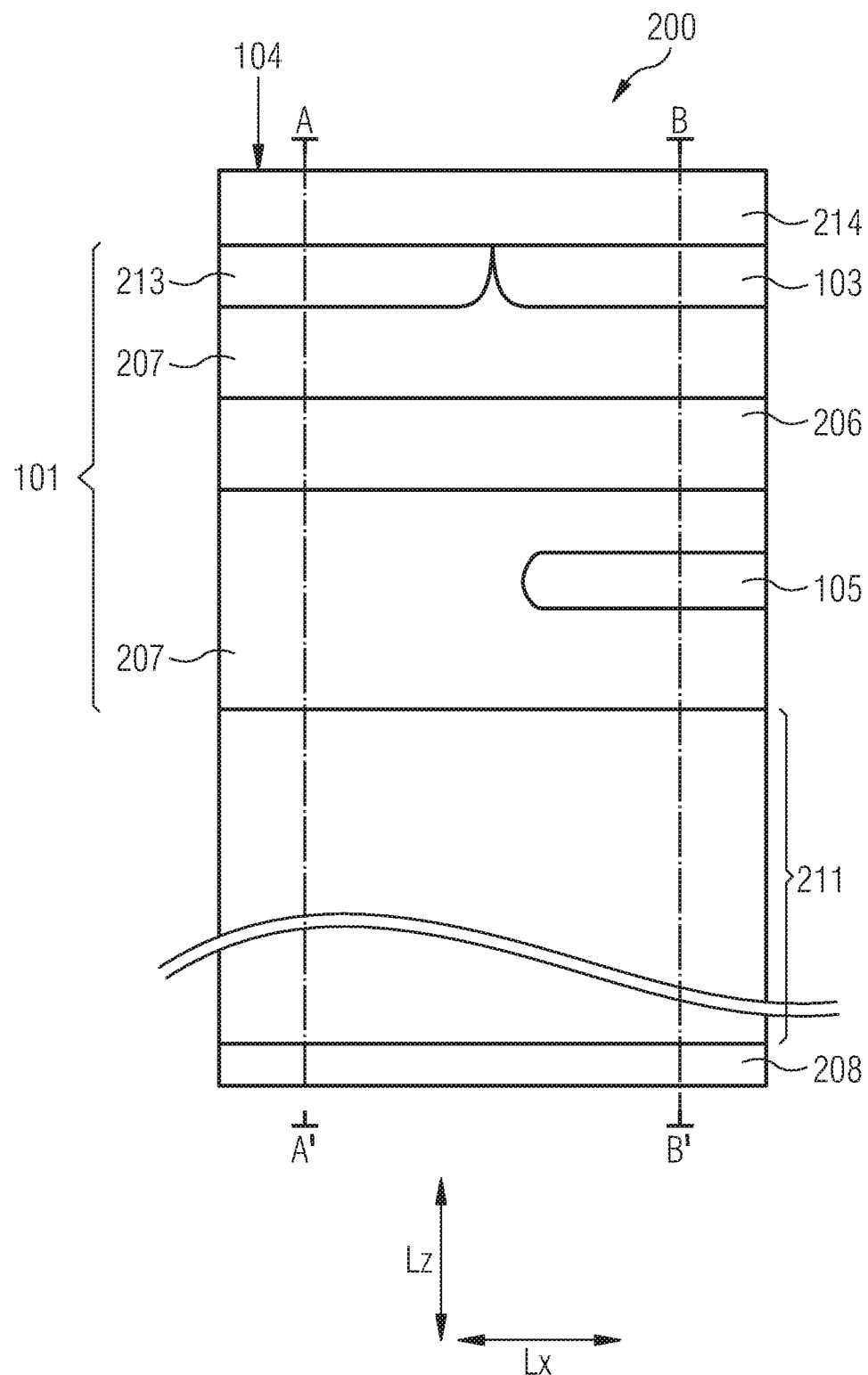
FIG. 2 shows a schematic illustration of a further semiconductor device.

FIG. 2 shows a schematic illustration of a semiconductor device 200 according to an embodiment.

The semiconductor device 200 may be similar to the semiconductor device described in connection with FIG. 1. The semiconductor device 200 may include a diode structure which may include deep lying, structured and highly doped (buried and non-depletable) doping regions (or anodes) and laterally separated surface n-type and p-type contact doping regions, for example.

The diode structure of the semiconductor device 200 may include the anode doping region 101 comprising the first conductivity type (e.g. p-type) arranged in the semiconductor substrate 102. The anode doping region 101 may include a first conductivity type contact doping portion 213, a buried recombination portion 206, a buried non-depletable portion 105, and a depletable portion 207 (or field stop portion).

The semiconductor device 200 further comprises the second conductivity type n-type) contact doping region 103 comprising the second conductivity type. The second conductivity type contact doping region 103 is arranged at the first surface 104 of the semiconductor substrate 102 and surrounded by the anode doping region 101.

The diode structure (also referred to herein as a manta diode) may include the deep lying buried non-depletable portion 105 (also referred to as an anode region or portion). At least part of the buried non-depletable portion 105 is located (vertically) below the second conductivity type contact doping region 103 in the semiconductor substrate 102.

The depletable portion 207 of the anode doping region 101 may comprise (or have) the first conductivity type (e.g. p-type). The depletable portion 207 of the anode doping region 101 may surround the buried non-depletable portion 105 in the semiconductor substrate 102. Optionally, the depletable portion 207 of the anode doping region 101 may be (or may include) a field stop doping portion of the anode doping region 101, for example.

The diode structure of the semiconductor device 200 may further include a drift region 211, which may be located adjacently (e.g. directly adjacently) to the anode doping region 101 of the diode structure. The drift region 211 may have the second conductivity type or the first conductivity type, for example.

The optional buried recombination portion 206 of the of the anode doping region 101 may comprise (or have) the first conductivity type (e.g. p-type). The buried recombination portion 206 may be located at least partially in the depletable doping portion 207, for example. A higher recombination rate of charge carriers may occur in the buried recombination portion 206 than in the depletable portion 207 of the anode doping region 101 and/or in the drift region 211, for example.

The diode structure of the semiconductor device 200 may further include a cathode doping region 208 comprising (or having) the second conductivity type, for example. The cathode doping region 208 may be arranged at a second surface opposite to the first surface. (e.g. at a back surface) of the semiconductor substrate 102, for example. The cathode doping region may be located at (e.g. directly adjacent to) the second surface of the semiconductor substrate 102.

The cathode doping region 208 may be located between the drift region 211 and the second surface of the semiconductor substrate 102, for example.

The (manta) diode structure of the semiconductor device 200 may make it possible for electrons from the flooding charging in the n-type drift region, to flow past the buried non-depletable portion 105 (e.g. the buried anode) across (or through or via) the n-contact region to the anode metal. For example, in the forward bias, electrons from cathode doping region 208 of the diode structure may flow past the buried non-depletable portion of the anode doping region 101. The current (or electrons) may flow towards (or to) the second conductivity type contact doping region 103. (For example, the current or electrons may flow through the second conductivity type contact doping region 103 electrically connected to the anode electrode structure 214 located at or on the first surface 104 of the semiconductor substrate 102).

The electrons flowing directly (to or through the second conductivity type contact doping region 103) do not lead to injection of holes (by the first conductivity type contact doping portion 213 of the anode doping region 101), for example. Only the electrons which recombine in the anode emitter (the first conductivity type contact doping portion 213 of the anode doping region 101) or that flow to the anode metal (the anode electrode structure 214) through the p-type contact region (the first conductivity type contact doping portion 213) may lead to the injection of holes and to the building of saturation charges in the drift zone, for example.

By controlling a depth distance (in a vertical direction, Lz) between the buried anode portion (buried non-depletable portion 105) to the contact region (the second conductivity type contact doping region 103), a lateral width (in a first lateral direction Lx) of the p-type contact region (the first conductivity type contact doping portion 213) and/or a lateral width (in a first lateral direction Lx) of the buried anode portion (the buried non-depletable portion 105), only a portion of electrons may lead to the injection of holes and the building of saturation charges, for example.

With increasing current densities, the density of the electron currents may also increase and therefore a path voltage drop of the electrons on the way to the n-type contact region (the second conductivity type contact doping region 103) may be experienced. More holes may be injected which may lead to an increase in the carrier flooding in the n-type drift region 211, and to a limited increase of the forward voltage of the diode and diode losses. The diode structure may therefore be more surge current resistant than convention anode structures with the same carrier flooding.

In reverse operation, the buried anode portion (the buried non-depletable portion 105) may shield out the electric field to the anode contact. The doping of the buried non-depletable portion 105 may be so high that it cannot be eliminated, for example. Despite the presence of the n-type doped contact region (the second conductivity type contact doping region 103), no increased reverse current flows, for example.

In operations till rated current, the front side flowing electrons do not (or should not) overcome the p+ barrier to the p-type contact region (the first conductivity type contact doping portion 213 of the anode doping region 101), and instead flow laterally across the n-type contact region (the second conductivity type contact doping region 103). For this operation, the lateral width of the p-type contact region (the first conductivity type contact doping portion 213 of the anode doping region 101) may be a few micrometers e.g. about 1 µm or e.g. less than 1 µm).

With commuting (or switching) of the diode (to the reverse bias), the excess charges need to be removed. For example, holes may flow out across the front side 104. In this operation, it may (or must) be ensured that the following holes do not overcome the p-n barrier to the n-type contact doping region (the second conductivity type contact doping region 103) and instead flow laterally across the p-type contact region (the first conductivity type contact doping portion 213). For this operation case, the n-contact doping region (the second conductivity type contact doping region 103) may have only a small lateral dimension (width) For example, the lateral width of the second conductivity type contact doping region 103 may be a few micrometers (or e.g. about 1 µm or e.g. less than 1 µm).

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (FIGS. 3A to 8).

Figure 3A:
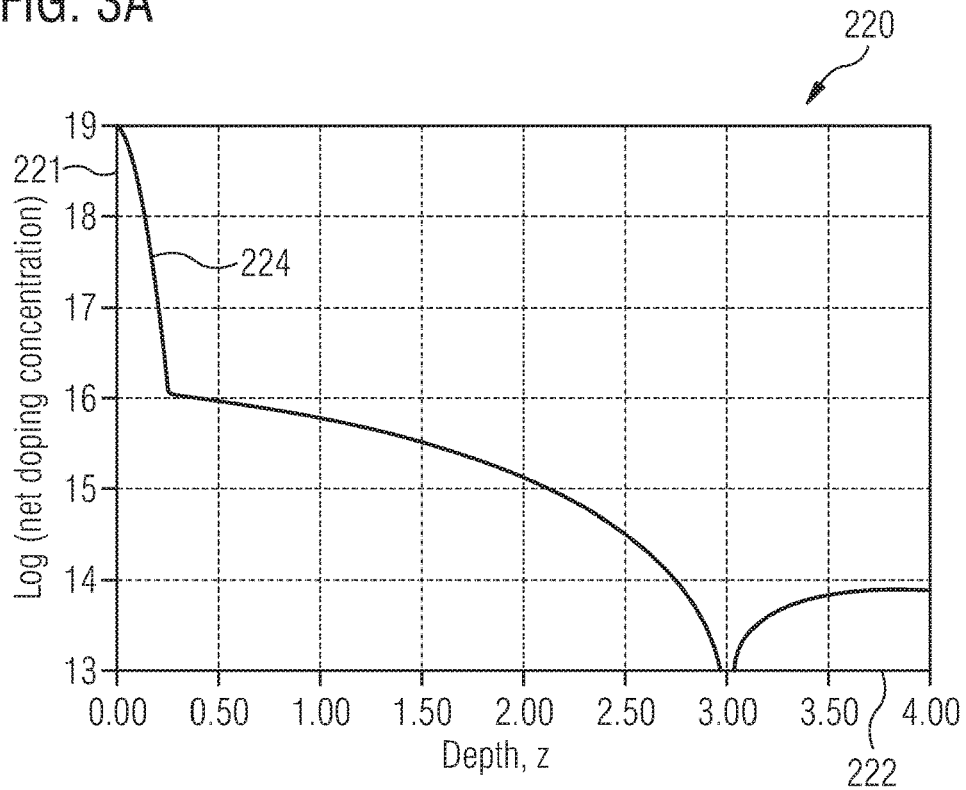
FIG. 3A shows a graphical illustration of dopant concentration versus semiconductor substrate depth of a portion of a diode structure of the semiconductor device.

FIG. 3A shows a graphical illustration 220 of dopant concentration 221 versus (vertical) semiconductor substrate depth 222 of the diode structure of the semiconductor device 200 along an imaginary vertical line A-A'.

Line 224 shows a dopant concentration profile of an example of a (manta) diode structure described in connection with semiconductor device 200. A maximum dopant concentration of the first conductivity type contact doping portion 213 of the anode doping region 101 may be at least $1*10^{18}$ dopants per $cm^3$, for example. For example, a doping dose of at least $1*10^{13}$ dopants per $cm^2$ (e.g. $1*10^{14}$ dopants per $cm^2$) may be used for incorporating (or e.g. implanting) the dopants for forming the first conductivity type contact doping portion 213 of the anode doping region 101.

Figure 3B:
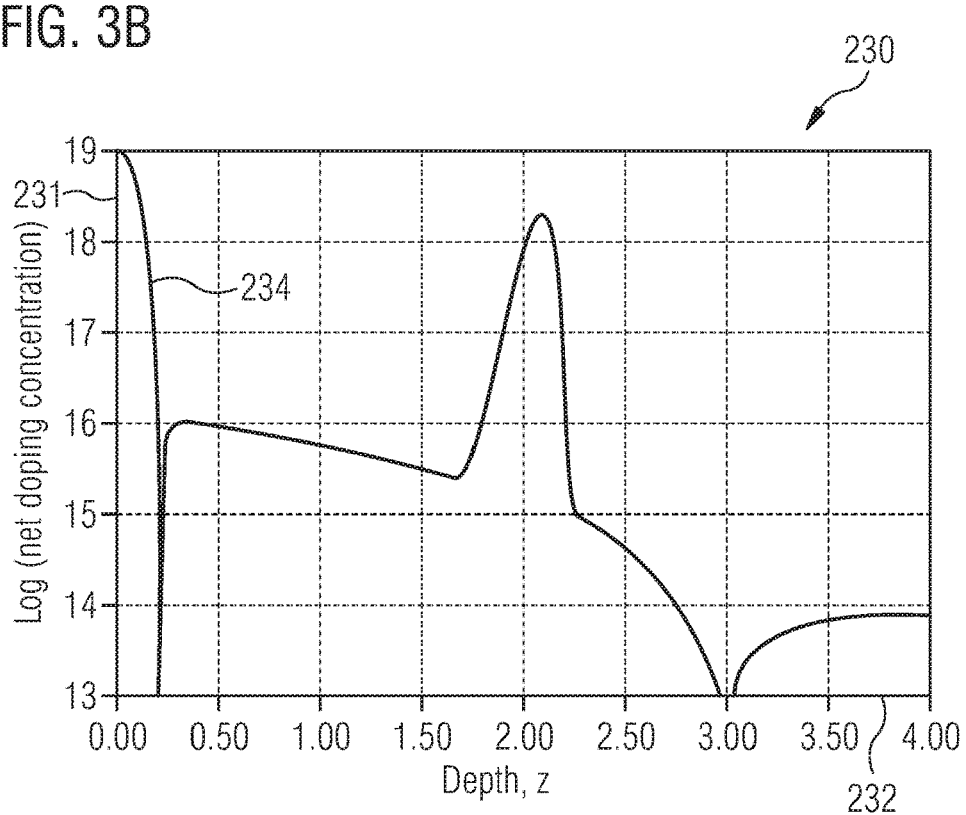
FIG. 3B shows a graphical illustration of dopant concentration versus semiconductor substrate depth of a further portion of the diode structure of the semiconductor device.

FIG. 3B shows a graphical illustration 230 of dopant concentration 231 versus (vertical) semiconductor substrate depth 232 of the diode structure of the semiconductor device 200 along an imaginary vertical line B-B'.

Line 234 shows a dopant concentration profile of the example of the (manta) diode structure described in connection with semiconductor device 200. A maximum dopant concentration of the buried non-depletable portion 105 of the anode doping region 101 may be at least $1*10^{18}$ dopants per $cm^3$, for example. For example, a doping dose of at least $5*10^{13}$ dopants per $cm^2$ (e.g. dopants per $cm^2$) may be used for incorporating (or e.g. implanting) the dopants for forming the buried non-depletable portion 105 of the anode doping region 101.

A maximum dopant concentration of the second conductivity type contact doping region 103 may be at least $1*10^{18}$ dopants per $cm^3$, for example $1*10^{19}$ dopants per $cm^3$. For example, a doping dose of at least $1*10^{14}$ dopants per $cm^2$ (e.g. $1*10^{15}$ dopants per $cm^2$) may be used for incorporating (or e.g. implanting) the dopants for forming the second conductivity type contact doping region 103.

A maximum dopant concentration of the anode doping region 101 may be at least $1*10^{15}$ dopants per $cm^3$, for example $1*10^{16}$ dopants per $cm^3$. For example, a doping dose of at least $1*10^{12}$ dopants per $cm^2$ (e.g. $2*10^{12}$ dopants per $cm^2$) may be used for incorporating (or e.g. implanting) the dopants for forming the second conductivity type contact doping region 103.

More details and aspects are mentioned in connection with the embodiments described above or below. The embodiment shown in FIGS. 3A and 3B may comprise one or more optional additional features corresponding to one or more aspects mentioned in connection with the proposed concept or one or more embodiments described above (e.g. FIGS. 1 to 2) or below (FIGS. 4 to 8).

Figure 4:
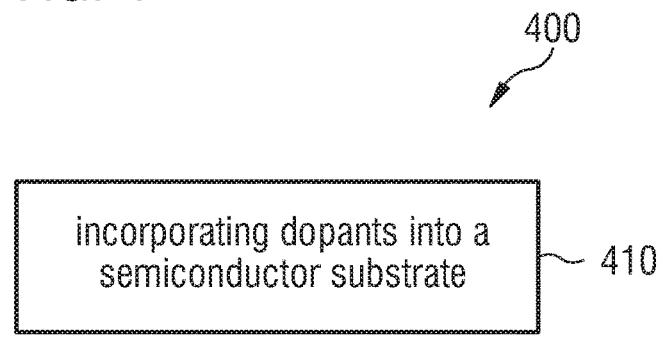
FIG. 4 shows a schematic illustration of a method for forming a semiconductor device.

FIG. 4 shows a schematic illustration of a method 400 for forming a semiconductor device according to an embodiment.

The method 400 comprises incorporating 410 dopants into a semiconductor substrate through a decelerating mask layer arranged at a surface of the semiconductor substrate, to simultaneously form at least one first conductivity type contact doping portion of an anode doping region located at the surface of the semiconductor substrate at a masked region of the semiconductor substrate and at least one buried non-depletable portion of the anode doping region located in the semiconductor substrate at unmasked regions of the semiconductor substrate.

Due to the incorporating 410 of the dopants into the semiconductor substrate to form the at least one first conductivity type contact doping portion at masked regions of the semiconductor substrate and at least one buried non-depletable portion at unmasked regions of the semiconductor substrate, a diode structure which combines a low carrier flooding in front of the anode with a higher robustness and surge current strength may be produced or manufactured more easily. For example, the non-depletable portion for shielding the anode contact may be formed without additional doping implantation processes.

Figure 9:
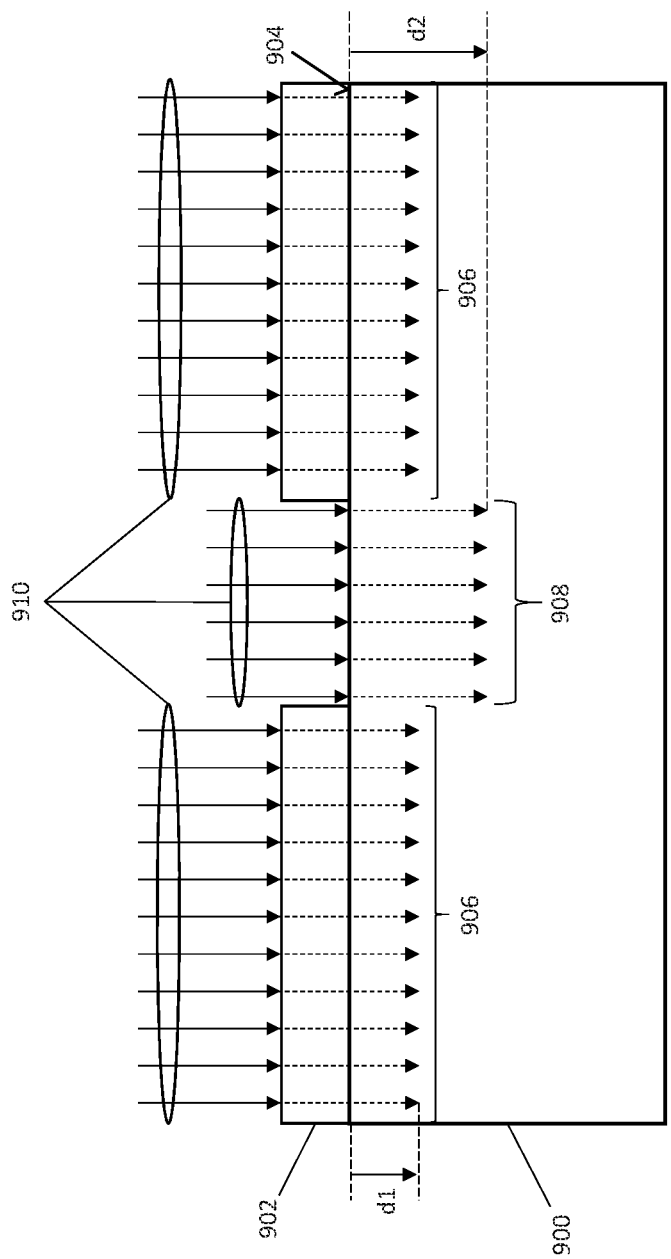
FIG. 9 shows a schematic illustration of a semiconductor substrate during the method illustrated in FIG. 4.

The method 400 may include forming the decelerating mask layer on a first surface of the semiconductor substrate. FIG. 9 shows the semiconductor substrate 900 with the decelerating mask layer 902 formed on the first surface 902. The decelerating mask layer 902 may include a masking layout or pattern so that at least one region 906 (e.g. one or more regions, or e.g. a plurality of regions) of the semiconductor substrate 900 are masked (e.g. covered by portions of the decelerating mask layer 902), and so that at least one region 908 (e.g. one or more regions, or e.g. a plurality of regions) of the semiconductor substrate 900 are unmasked (e.g. not covered by portions of the decelerating mask layer 902).

The method 400 may include incorporating 410 the dopants 910 into the semiconductor substrate 900 through the decelerating mask layer 902 from the first surface 904 of the semiconductor substrate 900, for example.

At masked regions 906 of the semiconductor substrate 900, the incoming dopants 910 passing through the decelerating mask layer 902 may be decelerated and/or decelerated by the decelerating mask layer 902. Thus, an average or maximum penetration depth d1 of dopants 910 incorporated through the masked regions 906 measured from the first surface 904 of the semiconductor substrate 900 may be smaller (or shallower) than an average or maximum penetration depth d2 of dopants 910 incorporated into the semiconductor substrate 900 at unmasked regions 908 of the semiconductor substrate 900. For example, a maximum of a dopant distribution profile of the dopants 910 incorporated into the semiconductor substrate 900 may lie at a smaller vertical depth d1 in the semiconductor substrate 900 than the dopants 910 incorporated into the semiconductor substrate 900 at unmasked regions 908 of the semiconductor substrate 900.

At unmasked regions 908 of the semiconductor substrate 900, the incoming dopants 910 may be incorporated into the semiconductor substrate 900 without being decelerated (or e.g. with minimal deceleration) by the decelerating mask layer 902. Thus, an average or maximum penetration depth d2 of the incorporated dopants 910 measured from the first surface 904 of the semiconductor substrate 900 may be larger (or deeper) than an average or maximum penetration depth d1 of the dopants 910 incorporated into the semiconductor substrate 900 at masked regions 906 of the semiconductor substrate 900. For example, a maximum of a dopant distribution profile of the dopants 910 incorporated into the semiconductor substrate 900 may lie at a deeper (or larger) vertical depth d2 in the semiconductor substrate 900 than the dopants 910 incorporated into the semiconductor substrate 900 at masked regions 906 of the semiconductor substrate 900.

The dopants 910 incorporated into the semiconductor substrate 900 below the masked regions 906 of the semiconductor substrate 900 may cause the first conductivity type of the at least one first conductivity type contact doping portion of the anode doping region of the diode structure, for example. The dopants 910 incorporated into the semiconductor substrate 900 below the unmasked regions 908 of the semiconductor substrate 900 may cause the first conductivity type of the at least one buried non-depletable portion of the anode doping region, for example. The dashed lines in FIG. 9 illustrate the dopants 910 entering either the decelerating mask layer 902 or the semiconductor substrate 100.

The implantation of both doping regions (e.g. the buried non-depletable portion and the first conductivity type doping portion) may be carried out through a single high energy implantation. In the area or region of the p-doped contact zone (the first conductivity type doping portion), the masking layer may stop (or decelerate) the implant ions so that they lie near to the semiconductor surface. The high energy implant may lead to a strong lateral scattering (or decelerating) of the p-type doping, which may be used during the complementary masking for the n-type and p-type doped contact zones to implement the suggested lateral overlap between the buried anode region and the n-type doped contact zone. For example, due to the lateral spreading of dopants in the p-type contact doping region, the n-type contact doping region formed laterally to the p-type contact doping region may be wholly overlapped (in a top view) by the buried p-type buried non-depletable portion.

The method 400 may further include annealing (e.g. heating) the semiconductor substrate to activate the incorporated dopants in the semiconductor substrate to form the at least one first conductivity type contact doping portion having the first conductivity type and the at least one buried non-depletable portion having the first conductivity type.

The at least one first conductivity type contact doping portion and the at least one buried non-depletable portion may thus be formed simultaneously (e.g. during or by the same dopant incorporation process) in the semiconductor substrate. Due to (or during) the annealing of the semiconductor substrate, a spreading of the dopants may occur in the semiconductor substrate may occur. This may lead to lateral overlap (e.g. of at least 10 nm, or e.g. of at least 50 nm) of the first conductivity type contact doping portion and the buried non-depletable portion in a top view of the semiconductor device 100 (e.g. from the first surface of the semiconductor substrate). The buried non-depletable portion may lie deeper in the semiconductor substrate than the first conductivity type contact doping portion, for example.

A maximum lateral width of the first conductivity type contact doping portion (after annealing) may be less than 5 µm (or e.g. less than 2 µm, or e.g. less than 1 µm), for example.

An average thickness of a (or each) first conductivity type contact doping portion (after annealing) may lie between 100 nm and 500 nm, (or e.g. between 200 nm and 400 nm), for example. More than 70% (or e.g. more than 80%) of the dopants incorporated through the masked regions may be located in the first conductivity type contact doping portion, for example.

A minimum vertical depth between the at least one buried non-depletable portion and the first surface of the semiconductor substrate (after annealing) may be at least than 1 µm (or e.g. at least 2 µm, or e.g. at least than 5 µm). A maximum lateral width of a (or each) buried non-depletable portion (after annealing) may be less than 5 µm (or e.g. less than 2 µm, or e.g. less than 1 µm), for example. An average or maximum vertical dimension in the vertical direction, Lz, (e.g. a height) of a (or each) buried non-depletable portion may lie between 100 nm and 500 nm, (or e.g. between 200 nm and 400 nm), for example.

Optionally, the method 400 may further include forming a depletable doping portion of the anode doping region before forming the at least one first conductivity type contact doping portion and the at least one buried non-depletable portion. The dopants incorporated into the semiconductor substrate at the unmasked regions may cause the first conductivity type of the buried non-depletable portion embedded in the depletable portion of the anode doping region.

Optionally, the method 400 may further include forming a buried recombination portion of the anode doping region in the depletable doping portion before or after forming the at least one buried non-depletable portion. The buried recombination portion may be formed by implanting helium dopants (e.g. ions or atoms) into the semiconductor substrate.

Optionally, the method 400 may further include forming a second conductivity type contact doping region at the first surface of the semiconductor substrate after forming the buried recombination portion of the anode doping region.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1 to 3B) or below (FIGS. 5 to 8).

Figure 5:
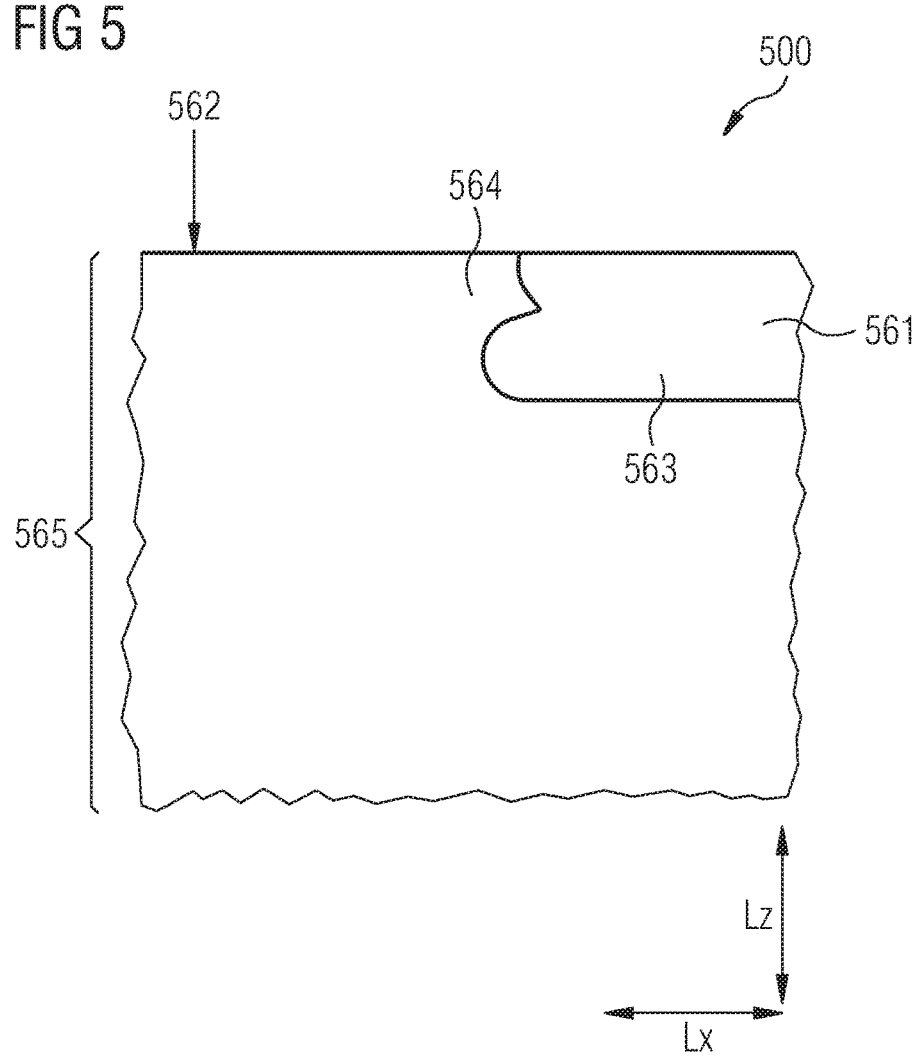
FIG. 5 shows a schematic illustration of a semiconductor device comprising a buried laterally extending portion.

FIG. 5 shows a schematic illustration of a semiconductor device 500 according to an embodiment.

The semiconductor device 500 comprises an anode doping region 561 comprising a first conductivity type arranged at a surface 562 of a semiconductor substrate 565. The anode doping region 561 comprises a buried laterally extending portion 563. The semiconductor device 500 further comprises a second conductivity type doping region 564 comprising the second conductivity type arranged vertically between the surface 562 of the semiconductor substrate 565 and the buried laterally extending portion 563 of the anode region 561. An aspect ratio between a maximum lateral dimension of the anode doping region and a maximum vertical dimension of the anode region is at least 5:1.

Due to an aspect ratio between a maximum lateral dimension of the anode doping region and a maximum vertical dimension of the anode region being at least 5:1, an avalanche proof diode, or a diode with increased robustness against drift influences of the edge structure may be provided. For example, the laterally graded anode doping may improve the commutating robustness of the diode, because in the forward bias operation, the injection of holes into the edge region and the carrier flooding in the edge areas may be reduced. During commutating, the holes flowing out of the edge termination region may see (or experience) a path resistance on the way to the anode connection, which the current density and the dynamic field enhancement in n-type region slows, for example. In addition, due to anode doping region being a deep reaching anode doping, improved surge current resistance may be obtained. The gradient of the minority carriers (electrons) in the anode may be reduced, for which reason higher carrier concentrations may be obtained at the border of the drift zone (substrate) than with a flat reaching anode emitter with same doping dose.

The (first) anode doping region 561 may comprise the first conductivity type and may be part of a diode structure arranged in the semiconductor substrate 565, for example. At least part of the anode doping region 561 may be electrically connected to an anode electrode (metallization) structure located at (or on) the first side) surface 562 of the semiconductor substrate 565.

The buried laterally extending portion 563 of the anode doping region 561 may have a maximum lateral width which lies between 1 µm and 5 µm (or e.g. between 2 µm and 4 µm, or e.g. between 2 µm and 3 µm), for example. The buried laterally extending portion 563 of the anode doping region 561 may have the same or a different maximum lateral width as a contact doping portion of the anode doping region 561 located adjacently to the first surface 562 of the semiconductor substrate 565. Optionally, a maximum lateral width of the buried laterally extending portion 563 may be at least 10% larger (or e.g. at least 20% larger, or e.g. at least 50% larger) than a maximum lateral width of the contact doping portion of the anode doping region 561. Optionally, a maximum lateral width of the buried laterally extending portion 563 may be at least 10% smaller (or e.g. at least 20% smaller) than a maximum lateral width of the contact doping portion of the anode doping region 561.

An average dopant concentration of the anode doping region 561 may be at least $1*10^{14}$ dopants per cm$^3$ (or e.g. at least $1*10^{15}$ dopants per cm$^3$, or e.g. at least $1*10^{14}$ dopants per cm$^3$). The average dopant concentration of the anode doping region 561 may be a measured number of dopants per volume averaged over the anode doping region 561, for example.

The second conductivity type doping region 564 is arranged vertically between the surface 562 of the semiconductor substrate 565 and the buried laterally extending portion 563 of the anode region 561. For example, at least part of the second conductivity type doping region 564 is arranged (directly) vertically between the first surface 562 of the semiconductor substrate 565 and at least part of the buried laterally extending portion 563 of the anode region 561.

The second conductivity type doping region 564 may be located in the edge termination region of the semiconductor substrate 565. Optionally, the second conductivity type doping region 564 may be located in (or may be part of) an epitaxial layer portion of the semiconductor substrate 565, for example. For example, the epitaxial layer portion may be formed at or grown on the surface of the semiconductor substrate 565.

Optionally, the epitaxial layer portion of the semiconductor substrate may be formed or grown on a surface of the semiconductor substrate 565 after forming the buried laterally extending portion 563 of the anode doping region 561 and before forming the contact doping portion of the anode doping region 561, for example.

The epitaxial layer portion may have the same (second) doping type as the semiconductor substrate, for example. Optionally, the epitaxial layer portion may have the same dopant concentration or different (e.g. a higher or, e.g. a lower) dopant concentration as the semiconductor substrate, for example.

Optionally, the semiconductor device 500 may include a back side cathode with an optional second field stop region and a cathode emitter, for example. For example, the semiconductor device 500 may include a cathode doping region and a cathode electrode (metallization) structure located at (or on) a second (opposite) surface of the semiconductor substrate 565 adjacent to the cathode doping region.

A maximum vertical dimension (height) of the anode doping region 561 in the vertical direction, Lz, may lie between 100 µm and 5 µm, (or e.g. between 500 nm and 4 µm, or e.g. between 1 µm and 2 µm), for example. The maximum vertical dimension of the anode region may be a largest height of the anode region 561 between the first surface 562 of the semiconductor substrate 565 and a bottom of the buried laterally extending portion 563 of the anode doping region 561. Optionally, the maximum vertical dimension of the anode region may be a largest height of the anode region 561 between the first surface 562 of the semiconductor substrate 565 and at least part of a cathode doping region located adjacently (e.g. directly adjacently) to the anode doping region 561, for example.

A maximum lateral width of the anode doping region 561 in the lateral direction, Lx, may lie between 1 µm and 5 µm (or e.g. between 2 µm and 4 µm, or e.g. between 2 µm and 3 µm), for example. The maximum lateral width of the anode region may be a largest dimension of the anode region 561 measured in the first lateral direction, Lx.

The aspect ratio between a maximum lateral dimension of the anode doping region and a maximum vertical dimension of the anode region is at least 5:1 (or e.g. at least 7:1, or e.g. at least 10:1, or e.g. at least 15:1), for example.

The semiconductor device 500 may further include at least one (e.g. one, or e.g. a plurality of) edge doping regions comprising (or having) the first conductivity type arranged in the edge termination region of the semiconductor substrate 565. An average dopant concentration of the one or more edge doping regions may be at least $1*10^{18}$ dopants per $cm^3$ (or e.g. at least $1*10^{19}$ dopants per $cm^3$, or e.g. at least $1*10^{20}$ dopants per $cm^3$). The average dopant concentration of the one or more edge doping regions may be a measured number of dopants per volume averaged over the one or more edge doping regions, for example.

The one or more edge doping regions may be located at a substantially similar (or substantially identical) vertical level (or vertical depth) in the semiconductor substrate 565 as each other. The one or more edge doping regions may be laterally separated from each other in (and/or by) the second conductivity type doping region 564. For example, portions of the second conductivity type doping region 564 may be located between neighboring edge doping regions.

Optionally, the one or more edge doping regions may be located at a substantially similar (or substantially identical) vertical level (or vertical depth) in the semiconductor substrate as the anode doping region 561. For example, the anode doping region 561 may vertically overlap more than 20% (or e.g. more than 50%, or e.g. more than 90%) of at least one edge doping region in a cross-sectional view perpendicular to the lateral surface. Optionally, the one or more edge doping regions may be located at a substantially similar (or substantially identical) vertical level (or vertical depth) in the semiconductor substrate as the buried laterally extending portion 563 of the anode doping region 561. Alternatively, the one or more edge doping regions may be located at a substantially similar (or substantially identical) vertical level (or vertical depth) in the semiconductor substrate as the contact doping portion of the anode doping region 561, for example.

As described in connection with FIGS. 1 to 3B, optionally, the semiconductor device 500 may include a second conductivity type contact doping region comprising a second conductivity type. Optionally, the second conductivity type contact doping region may be arranged at a surface 562 of the semiconductor substrate and surrounded in the semiconductor substrate by the anode doping region 561. Optionally, the anode doping region 561 may include a buried non-depletable portion, wherein at least part of the buried non-depletable portion is located below the second conductivity type contact doping region in the semiconductor substrate. Optionally, the anode doping region 561 and the second conductivity type contact doping region may be electrically connected to an anode electrode structure located at the surface 562 of the semiconductor substrate 565. Optionally, the buried non-depletable portion of the anode doping region 561 may laterally overlap the whole of the second conductivity type contact doping region in a top view of the semiconductor device 500. Optionally, the anode doping region 561 may include the contact doping portion (having the first conductivity type) located laterally adjacently to the second conductivity type contact doping region at the surface 562 of the semiconductor substrate 565. Optionally, a dopant concentration of the buried non-depletable portion of the anode doping region 561 may be higher than a dopant concentration of the (first conductivity type) contact doping portion of the anode doping region 561. Optionally, the (first conductivity type) contact doping portion of the anode doping region 561 may be located between two second conductivity type contact doping regions. A maximum lateral width of the (first conductivity type) contact doping portion between the two second conductivity type contact doping regions may be less than 5 µm, for example. Optionally, the second conductivity type contact doping region may be located between two (first conductivity type) contact doping portions of the anode doping region 561. A maximum lateral width of the second conductivity type contact doping region between the two first conductivity type contact doping portions may be less than 5 µm, for example. Optionally, the buried non-depletable portion of the anode doping region 561 may have a dopant concentration non-depletable by voltages applied to the semiconductor device during blocking operation. Optionally, the buried non-depletable portion of the anode doping region 561 may be embedded in a depletable portion of the anode doping region 561. Optionally, at least part of the depletable portion of the anode doping region 561 may be located between the buried non-depletable portion of the anode doping region 561 and a cathode doping region of the diode structure. Optionally, the anode doping region 561 may include a field stop doping portion. Optionally, a dopant concentration of the buried non-depletable portion of the anode doping region 561 may be at least five times larger than a dopant concentration of the depletable portion of the anode doping region 561.

Optionally, al least part of the buried recombination portion of the anode doping region may be located vertically between the second conductivity type contact doping region and the buried non-depletable portion of the anode doping region, for example. Optionally, the anode doping region 561 may further include a buried recombination portion. The buried recombination portion may include a higher average concentration of recombination centers than the drift region. Optionally, at least part of the drift region may be located between the depletable portion of the anode doping region 101 and a cathode doping region. Optionally, the cathode doping region of the diode structure may be arranged at a second surface of the semiconductor substrate. The cathode doping region may have the second conductivity type. At least a portion of the anode doping region 561 may be located between the second conductivity type contact doping region and the cathode doping region. Optionally, the diode structure may have a blocking voltage of at least 100 V.

Deep reaching anode emitters may be implemented through the introduction of acceptors through implantation and/or in-diffusion with a corresponding high temperature budget. This may lead to high temperatures in the heating (oven) processes (e.g. up to 1150° C. to 1240° C.) over a few hours. Furthermore, the implementation of lowly doped anode emitters is challenging, for example. The high temperatures may be suitable for small wafer diameters (e.g. 75 mm to 100 mm, or till 125 mm). However, for larger wafer diameters from 150 mm, this may lead to crystal errors, and may only be feasible with a large budget or expenditure, for example.

The various examples relate to structures and a method for forming deep reaching anodes and a relative freely adjustable and low doping dose in the anode. In connection with different variations (e.g. at least two) variations of the edge doping regions in the edge termination region, an avalanche proof diode, or diodes with increased robustness against drift influences of the edge structure may be provided.

For a series of diode components (or devices), an anode which is deep reaching into the semiconductor may be used to improve the performance of the diode components (or devices). Some examples are diodes with good robustness against cosmic radiation, or diodes with very high emitter efficiency of the anode. A deep reaching anode and an edge termination near the surface may provide an avalanche proof diode which may provide diodes with improved performance, for example.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1 to 4) or below (FIGS. 6A to 8).

Figure 6A:
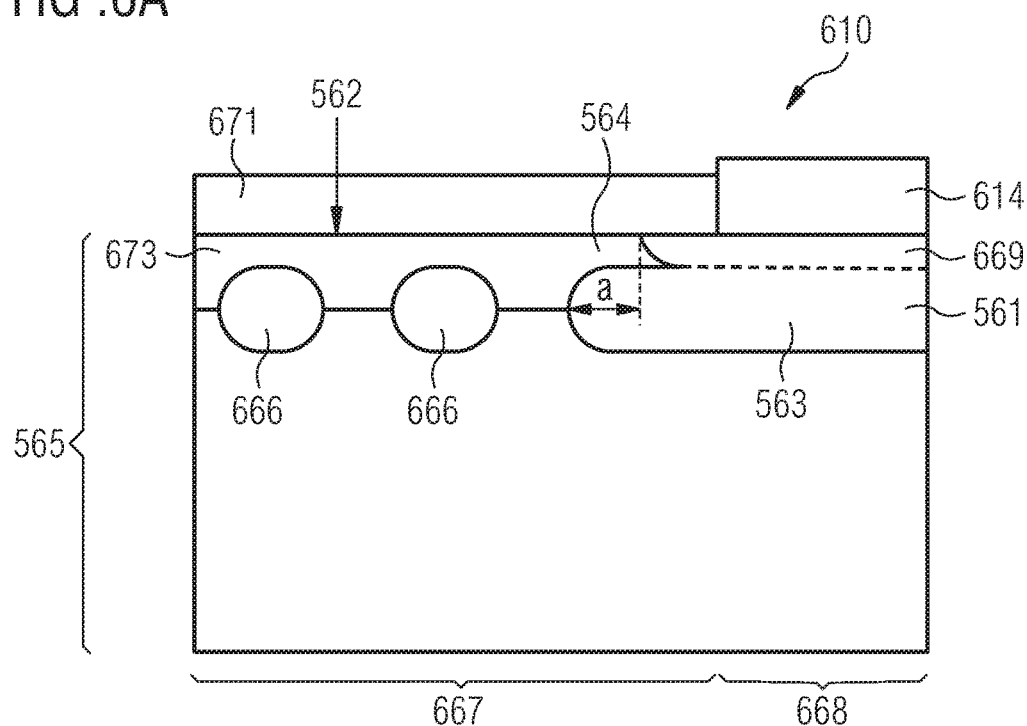
FIG. 6A shows a schematic illustration of a semiconductor device comprising at least one buried edge doping region.

FIG. 6A shows a schematic illustration of a semiconductor device 610 according to an embodiment.

The semiconductor device 610 may be similar to the semiconductor device described in connection with FIG. 5.

The semiconductor device 610 may include at least one (e.g. one, or e.g. a plurality of) edge doping regions 666 comprising (or having) the first conductivity type arranged in the edge termination region 667 of the semiconductor substrate 565.

The one or more edge doping regions 666 may be located at a substantially similar (or substantially identical) vertical level (or vertical depth) in the semiconductor substrate as the buried laterally extending portion 563 of the anode doping region 561. For example, the buried laterally extending portion 563 may vertically overlap more than 20% (or e.g. more than 50%, or e.g. more than 90%) of the one or more edge doping regions 666 in a cross-sectional view perpendicular to the lateral surface. For example, at least part of the epitaxial layer portion 673 of the semiconductor substrate 565 may be located between the one or more edge doping regions 666 and an electrically insulating structure 671 may be located at the first surface 562 of the semiconductor substrate 565.

The anode doping region 561 may extend laterally from the active region 668 of the semiconductor substrate 565 into the edge termination region 667 of the semiconductor substrate 565. For example, at least part of (e.g. a first portion) of the anode doping region 561 may be located in the active region 668 of the semiconductor substrate 565. Additionally or optionally, at least part of (e.g. a second portion of the anode doping region 561 may be located in the edge termination region 667 of the semiconductor substrate 565.

Optionally, a maximum lateral width of the buried laterally extending portion 563 may be larger (e.g. at least 10% larger or e.g. at least 20% larger, or e.g. at least 50% larger) than a maximum lateral width of the contact doping portion of the anode doping region 561.

Above the active region 668 of the semiconductor substrate 565, an anode electrode structure 614 may be located at (or on) the first surface 562 of the semiconductor substrate 565. The portion of the anode doping region 561 located in the active region 668 of the semiconductor substrate 565 (e.g. a part of the contact doping portion 669 of the anode doping region 561 located in the active region 668) may be located directly adjacent to the anode electrode structure 614, and electrically connected to the anode electrode structure 614.

Above the edge termination region 667 of the semiconductor substrate 565, the electrically insulating (dielectric or passivation) structure 671 may be located at (or on) the first surface 562 of the semiconductor substrate 565. The electrically insulating (dielectric or passivation) structure 671 may include one or more passivation or dielectric layers (e.g. imide, nitride, plastic or oxide layers), for example. At least part of the contact doping portion 669 of the anode doping region 561 may be located in the edge termination region and may be located directly adjacent to at least part of the electrically insulating structure 671, for example.

Optionally, the second conductivity type doping region 564 may be located in (or may be at least part of) the epitaxial layer portion 673 of the semiconductor substrate 565 located in the edge termination region 667, for example. Optionally, the contact doping portion 669 of the anode doping region 561 may be located in the epitaxial layer portion 673 of the semiconductor substrate 565. Additionally or optionally, at least a (top) part of the buried laterally extending portion 563 may be located in the epitaxial layer portion 673 of the semiconductor substrate 565.

The floating p-type regions (e.g. the edge doping region) may be implanted (during a first implantation) in the edge region in the first level (at the same level as the buried laterally extending portion). The floating p-type regions (edge doping regions) may enclose the active region by a ring form. In the region of the anode, the buried doping region (e.g. the buried laterally extending portion 563) may extend laterally further in the direction of the edge than the later anode connection (e.g. than the contact doping portion 669 of the anode doping region). After the deposition of the epitaxially introduced semiconductor layer 673, the second implantation may be carried out (e.g. to form the contact doping portion 669). In a temperature (annealing) step, the first and second implantations regions may diffuse in the region of the anode. In this way the first implanted region 563 may be electrically connected with the anode, for example.

For example, a 3 µm diffusion length may be easily implemented, which is why in this case a p-n junction to a depth of 9 µm may be produced, whereas the temperature budget corresponds to that of a 3 µm diffusion length or ⅑ of that for a 9 µm diffusion length. A 6 µm thick epitaxial layer may also be deposited easily in a single step.

With the semiconductor device 610, the highest field strength may lie in the edge buried in the semiconductor region. The influence (e.g. from external charges) in the edge region may be reduced due to the reduced field strength at the semiconductor surface to the dielectric structure. Optionally, or alternatively, the semiconductor device 610 may further include field plates located in the edge termination region.

The laterally graded anode doping may improve the commutating robustness of the diode, because in forward bias operation, the injection of holes into the edge region and the carrier flooding in the edge areas may be reduced. Thus, the distance "a" in the buried laterally extending portion 563 may be up to (or at least) 3 times the ambipolar diffusions length. For example, the distance "a" may lie between 10 µm and 300 µm, depending on the voltage class of the semiconductor device. The holes flowing out of the edge termination region during commutating may see (or experience) a path resistance on the way to the anode connection, which the current density and the dynamic field enhancement in n-type region slows, for example.

Figure 6B:
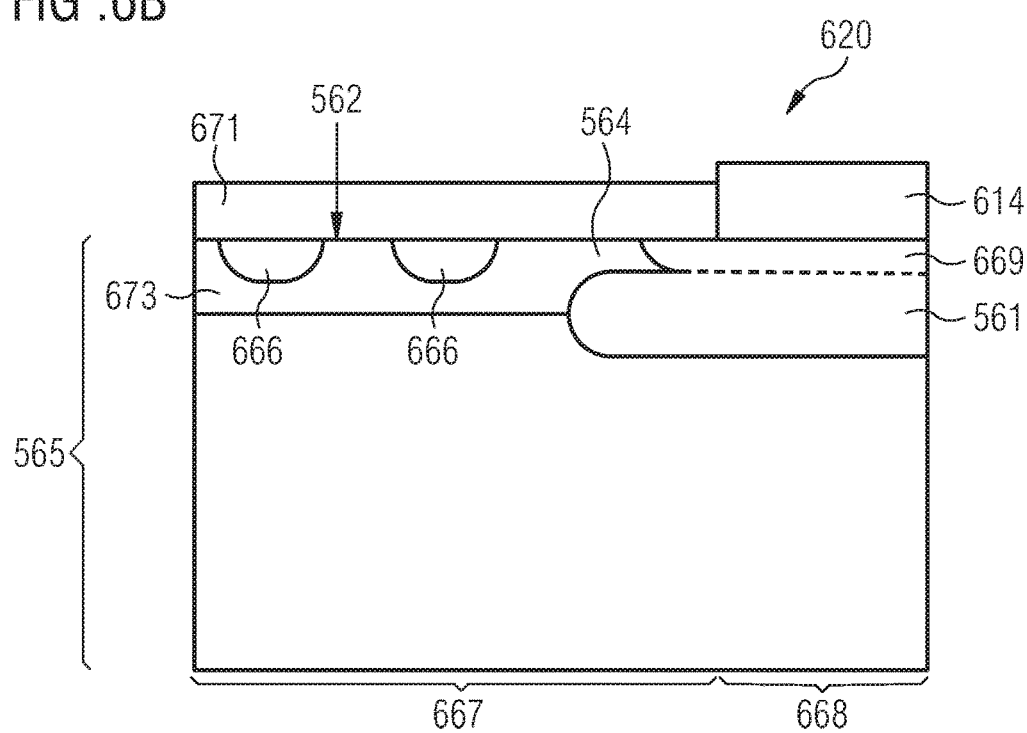
FIG. 6B shows a schematic illustration of a semiconductor device comprising at least one edge doping region at a surface of the semiconductor substrate.

FIG. 6B shows a schematic illustration of a semiconductor device 620 according to an embodiment.

The semiconductor device 620 may be similar to the semiconductor device described in connection with FIG. 6A. However, instead of the one or more edge doping regions 666 being wholly buried in the edge termination region, the one or more edge doping regions 666 may be located at the first surface 562 of the semiconductor substrate directly adjacent to the electrically insulating structure 671, for example.

The one or more edge doping regions 666 may be located at a substantially similar (or substantially identical) vertical level (or vertical depth) in the semiconductor substrate 565 as the contact doping portion 669 of the anode doping region 561. For example, the contact doping portion 669 may vertically overlap more than 20% (or e.g. more than 50%, or e.g. more than 90%) of the one or more edge doping regions 666.

Optionally, the diode structure of the semiconductor device 620 may include a surface p-type ring at the edge (e.g. the edge termination region). Additionally or alternatively, a field plate or other edge construction may be located in the edge termination region, for example.

The diode structure of the semiconductor device 620 may have a thickness in the edge termination region which is thicker (e.g. a few micrometers) thicker than in the active region. It may thus be possible to pin the breakdown in the region of the anode, because the field strength may be geometrically reduced in the edge region. Due to the flat breakdown region in the region of the anode, the power dissipation in breakdown cases may be distributed over a large area, and may dissipate a significantly higher energy in the component (or device) in comparison to a line formed breakdown region in the edge.

With higher currents, silicon under the bond wires may be fed locally with current. A highly doped region (e.g. the contact doping portion 669 $I^2 2$) may absorb the current from the metallization and spread it in the semiconductor region. The current can flow vertically locally in the metal and then lateral spread wider in region (e.g. the contact doping portion 669 $I^2 2$), so that in the anode of the diode, the current may be conducted homogenously over the entire area in the underlying anode emitter (e.g. the contact doping portion 669 $I^2 1$) of the diode.

A further positive aspect of surge current resistance may be achieved due to the deep reaching heavily doped anode doping. The gradient of the minority carriers (electrons) in the anode may be reduced, for which reason higher carrier concentrations may be obtained at the border of the drift zone (substrate) than with a flat reaching anode emitter with same doping dose. For example, an essential (main or substantial) part of the anode doping may be higher than a carrier density of the flooding charge in the drift zone.

The surge current resistance of the diode may be increased due to the structure of the anode emitter and through the additional thermal capacity of the epitaxial silicon layer. The additional thermal capacity may improve not too high blocking devices (e.g. e.g. having a blocking voltage up to or less than 600V).

The deep (buried or surface) p-type rings in the edge termination region may reduce the electrical field structure above in the semiconductor. This may improve components (or devices) with plastic (e.g. imide and/or silicon compound) passivation, because with these materials, smaller electrical field strength are permitted than with oxide passivation, for example. Thus, edge termination structure elements may be considered (e.g. minimum or maximum distances of field plates and/or nitride thickness) to reduce the electric field peaks occurring locally at the field plates to acceptable values.

FIG. 6C shows a schematic illustration of a semiconductor device 630 according to an embodiment.

The semiconductor device 630 may be similar to the semiconductor device described in connection with FIG. 6B. Unlike the semiconductor device described in connection with FIG. 6B, a maximum lateral width of the buried laterally extending portion 563 may be equal to or alternatively, smaller than (e.g. at least 10% smaller, or e.g. at least 20% smaller) than a maximum lateral width of the contact doping portion 669 of the anode doping region 561. For example, the buried laterally extending portion 563 may lie the same way (e.g. have the same lateral width) as the contact doping portion 669 or jump back (or be cut back) in the direction of the active region 668. Optionally, the whole of the buried laterally extending portion 563 may lie within the active region 668. The semiconductor device 630 may relieve the anode end and therefore promote avalanche resistance (punch-through under the buried laterally extending portion 563 $I^2 1$).

FIG. 6D shows a schematic illustration of a semiconductor device 640 according to an embodiment.

The semiconductor device 640 may be similar to the semiconductor device described in connection with FIGS. 6B and 6C.

Additionally or alternatively, the anode doping region 561 may include more than one buried laterally extending portion. For example, the anode doping region 561 may include the first buried laterally extending portion 561 and the second buried laterally extending portion 672.

Optionally, the second buried laterally extending portion 672 of the anode doping region 561 may be located (vertically) between the first buried laterally extending portion 563 of the anode doping region 561 and the contact doping portion 669 of the anode doping region 561, for example.

The semiconductor substrate 565 may include the first epitaxial layer portion 673 and a second epitaxial layer portion 674 formed on the first epitaxial layer portion 673, for example. Optionally, at least a (top) part of the first buried laterally extending portion 563 may be located in the first epitaxial layer portion 673 of the semiconductor substrate 565, for example. Additionally or optionally, at least a (top) part of the second buried laterally extending portion 672 may be located in the second epitaxial layer portion 674 of the semiconductor substrate 565, for example. Additionally or optionally, the contact doping portion 669 of the anode doping region 561 may be located in the second epitaxial layer portion 674 of the semiconductor substrate 565.

Optionally, the first epitaxial layer portion 673 may have a minimum (vertical) thickness of at least 2 µm (or e.g. at least 6 µm, or e.g. at least 8 µm) for example. Optionally, the second epitaxial layer portion 674 may have a minimum (vertical) thickness of at least 2 µm (or e.g. at least 6 µm, or e.g. at least 8 µm) for example.

A maximum lateral width of the first buried laterally extending portion 563 may be different from a maximum lateral width of the second buried laterally extending portion 672, for example. A maximum lateral width of the first buried laterally extending portion 563 and a maximum lateral width of the second buried laterally extending portion 672 may be different from a maximum lateral width of the contact doping portion 669 of the anode doping region 561, for example.

Optionally, the maximum lateral width of the first buried laterally extending portion 563 may be larger (e.g. at least 10% larger or e.g. at least 20% larger, or e.g. at least 50% larger) than a maximum lateral width of the contact doping portion 669 of the anode doping region 561. Additionally or optionally, the maximum lateral width of the second buried laterally extending portion 672 may be smaller (e.g. at least 10% smaller or e.g. at least 20% smaller) than a maximum lateral width of the contact doping portion 669 of the anode doping region 561. Alternatively, the maximum lateral width of the first buried laterally extending portion 563 may be smaller than the maximum lateral width of the contact doping portion 669 of the anode doping region 561, and the maximum lateral width of the second buried laterally extending portion 672 may be larger than a maximum lateral width of the contact doping portion 669 of the anode doping region 561.

At least part of the second conductivity type doping region 564 may be arranged vertically between the first surface 562 of the semiconductor substrate 565 and the second buried laterally extending portion 561 of the anode region 561, for example. Optionally, the second conductivity type doping region 564 may be located in the second epitaxial layer portion 674 of the semiconductor substrate 565, for example.

The semiconductor device 640 may be produced by a multi stage application of a method. For example, an additionally deposited epitaxial layer may be deposited with implantation. For example, the method can be carried out many times one after the other. For example, a plurality of epitaxial layers may be formed one after the other. Thus, the effect to relieve the edge region of electric field peaks may be strengthened.

Figure 6E:
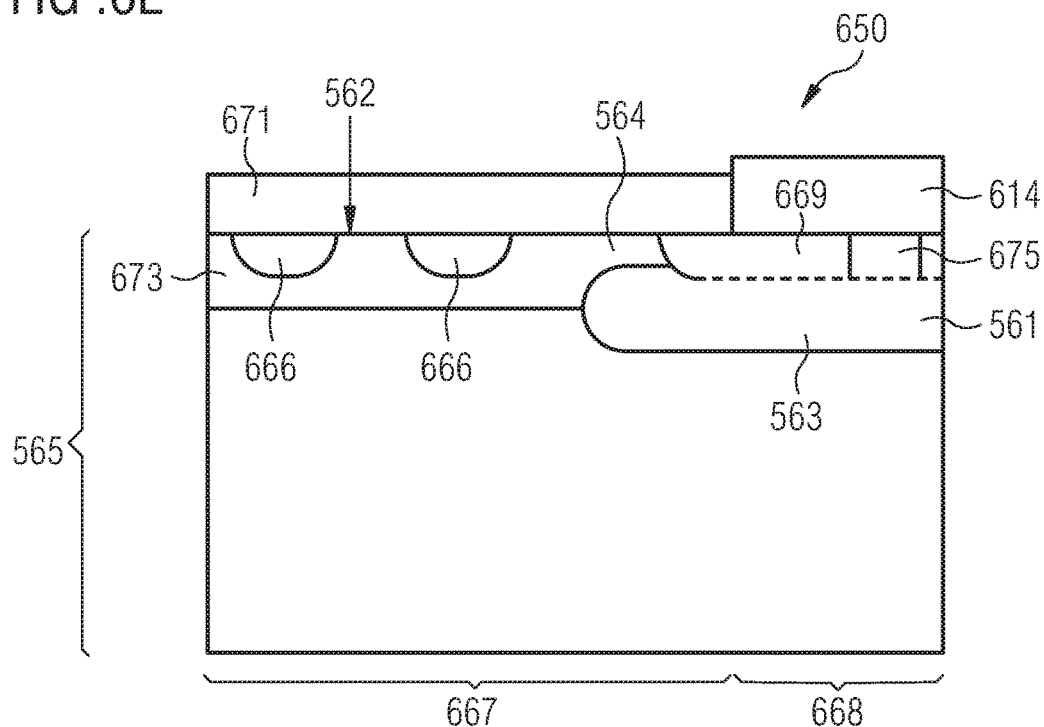
FIG. 6E shows a schematic illustration of a semiconductor device comprising a second conductivity type contact doping region.

FIG. 6E shows a schematic illustration of a semiconductor device 650 according to an embodiment.

The semiconductor device 650 may be similar to the semiconductor devices described in connection with FIGS. 6A to 6D.

Additionally or optionally, the semiconductor device 630 may further include a second conductivity type contact doping region 674. The second conductivity type contact doping region 674 may be laterally surrounded by the anode doping region 561. For example, the second conductivity type contact doping region 674 may be located laterally between two contact doping portions 669 of the anode doping region 561, for example. At least part of the buried laterally extending portion 563 of the anode doping region 561 may be located at a bottom of (e.g. vertically adjacently to) the second conductivity type contact doping region 674. The second conductivity type contact doping region 674 may be electrically connected to the anode electrode structure 614 located at the first surface 562 of the semiconductor substrate 565

An average dopant concentration of the second conductivity type contact doping region 674 may be at least $1*10^{16}$ dopants per $cm^3$ (or e.g. at least $1*10^{17}$ dopants per $cm^3$, or e.g. at least $1*10^{18}$ dopants per $cm^3$). The average dopant concentration of the second conductivity type contact doping region 674 may be a measured number of dopants per volume averaged over the second conductivity type contact doping region 674, for example.

The semiconductor device 650 may include the second conductivity type contact doping region 674 (an n-type island). Additionally or alternatively to the described direction of strong emitter and improving the surge current resistance, the semiconductor device 650 may experience reduced flooding (or saturation) in the substrate. The n-type island may be in ohmic contact with the anode metallization, for example. Electrons from the flooding (or saturation) charges in the drift zone of the diode (e.g. the substrate), must not completely recombine at the metal-semiconductor interface. Instead they can flow over the n region in the contact doping portion 669 $I^22$. In other words, an npn transistor may be realized which may conduct a portion of the load current as electron current. Thus, the effective emitter efficiency of the anode for injection of holes in the drift zone may be reduced, which may lead to dynamic favorable behavior of the diode by commutating. The structure with the buried anode layer (e.g. the buried laterally extending portion 563 $I^21$) may support the homogeneity of the component (or device), because there is a higher (but very thin) acceptor concentration, which blocks the electric field in commutating and in the blocking operation, which may lead to uniform conduction for the current transport.

Then region may be introduced in fixed intervals (e.g. as points or lines). The width of an n region may be smaller than the thickness of the epi layer, to make possible uniform electron and hole current flow. The introduction of the n-type island may results in improved surge current resistance of the npn transistor even with increasing temperature. For example, the injection of holes in the drift zone, and the carrier flooding may be effectively reduced. Through dimensioning of the n region, the temperature coefficient of the forward voltage of the diode may be specifically or purposefully varied and be easily led in a direction of positive temperature coefficient, which may be specially desired for the parallel commutating of the diodes, for example.

More details and aspects are mentioned in connection with the embodiments described above or below. The embodiments shown in FIGS. 6A to 6E may each comprise one or more optional additional features corresponding to one or more aspects mentioned in connection with the proposed concept or one or more embodiments described above (e.g. FIG. 1 to 5) or below (FIGS. 7 to 8).

Figure 7:
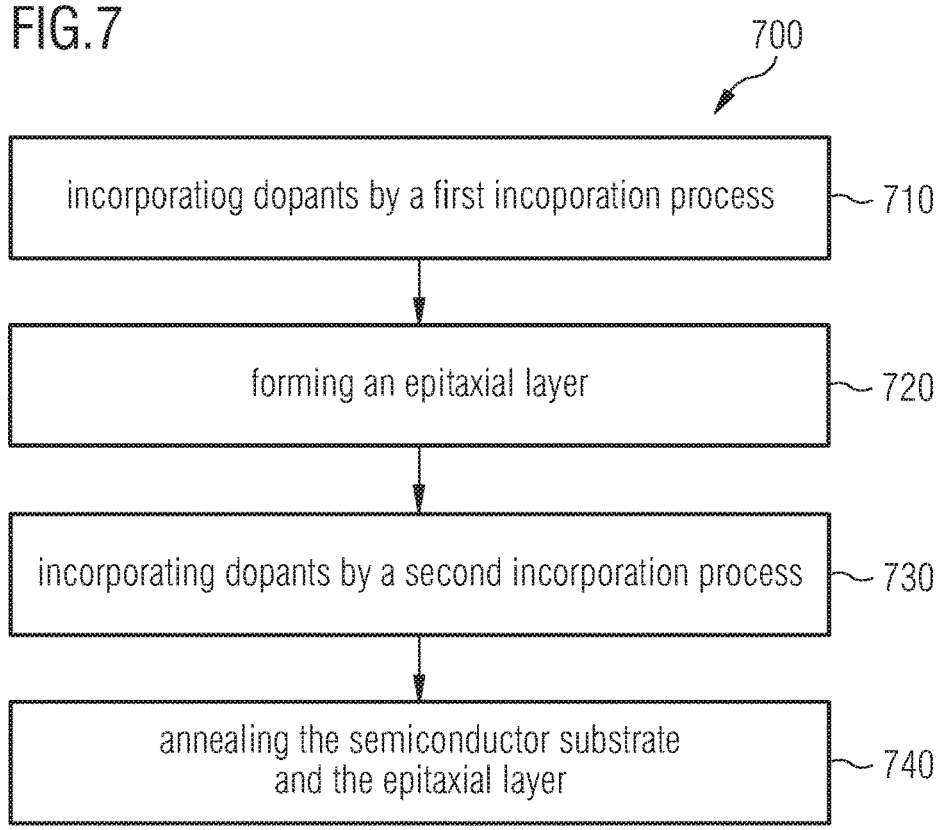
FIG. 7 shows a schematic illustration of a method for forming a semiconductor device.
Figure 8:
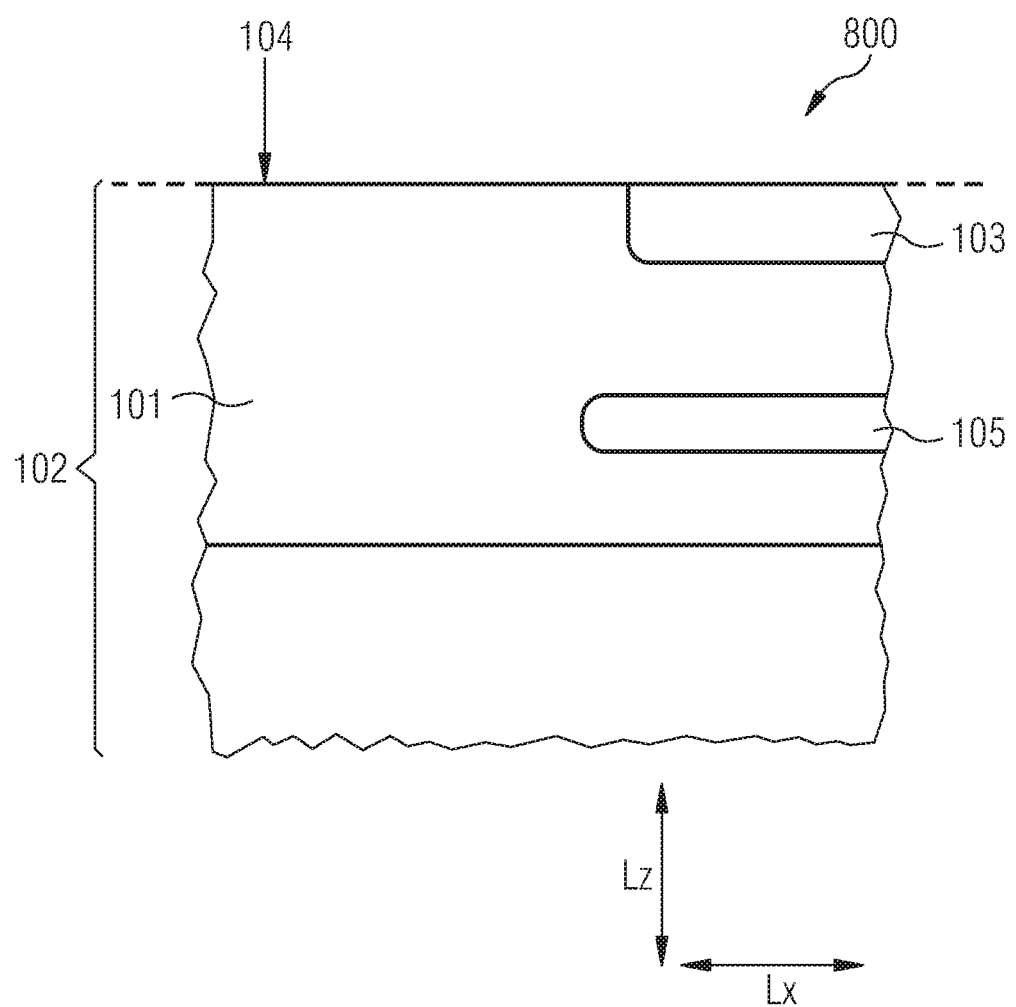
FIG. 8 shows a schematic illustration of a diode device.

FIG. 7 shows a schematic illustration of a method 700 for forming a semiconductor device according to an embodiment.

The method 700 comprises incorporating 710, by a first incorporation process, dopants of a first conductivity type to form a first doping area of an anode doping region to be formed in proximity to a surface of a semiconductor substrate. The method 700 further comprises forming 720 an epitaxial layer on the surface of the semiconductor substrate. The method 700 further comprises incorporating 730, by a second incorporation process, dopants of the first conductivity type to form a second doping area of the anode doping region in proximity to a surface of the epitaxial layer. A dopant concentration of the dopants incorporated into the second doping area is larger than a dopant concentration of dopants of the second conductivity type in the epitaxial layer. A vertical dimension of the second doping area is smaller than a vertical dimension of the epitaxial layer. The method 700 further comprises annealing 740 the semiconductor substrate and the epitaxial layer to enlarge the first doping area and the second doping area due to diffusion of dopants to form a merged anode doping region extending from the surface of the epitaxial layer vertically deeper than the first doping area. An aspect ratio between a maximum lateral dimension of the anode doping region and a maximum vertical dimension of the anode doping region is at least 5:1.

Due to the annealing of the semiconductor substrate and the epitaxial layer to enlarge the first doping area and the second doping area to form a merged anode doping region, deep reaching anodes may be formed easily, and their doping doses may be easily adjustable, for example.

The dopants of the first conductivity type may be incorporated 710 into the semiconductor substrate by ion implantation for example The dopants of the first conductivity type may be incorporated 710 to form the first doping area at a surface of a semiconductor substrate. The dopants of the first conductivity type may cause the anode region to be formed to have the first conductivity type after annealing or activation of the dopants, for example. Optionally, an implantations dose of at least $1*10^{12}$ ions per cm$^2$ (or e.g. at least $1*10^{13}$ ions per cm$^2$, or e.g. between $1*10^{12}$ ions per cm$^2$ and $1*10^{14}$ ions per cm$^2$) may be used for incorporating 710 the dopants. Optionally an implantation energy of between 10 keV and 80 keV (e.g. 45 keV, or e.g. between 20 keV and 50 keV) may be used for incorporating 710 the dopants.

The first doping area of the anode doping region may be located (wholly or at least partially) in the active region of the semiconductor substrate. Optionally, at least part of the first doping area of the anode doping region may be located in the edge termination region of the semiconductor substrate, for example.

Optionally, dopants of the first conductivity type may be incorporated simultaneously into at least one (buried) edge doping region (e.g. one or more edge doping regions, or e.g. a plurality of edge doping regions) located in an edge termination region of the semiconductor substrate during the incorporating of dopants causing the first conductivity type into the first doping area of the anode doping region to be formed.

After incorporating 710 the dopants into the first doping area of the anode doping region, the epitaxial (e.g. semiconductor) layer may be formed 720 on the surface of the semiconductor substrate. Optionally, dopants of the second conductivity type may be incorporated into the epitaxial layer during or after the formation (e.g. growth) of the epitaxial layer on the surface of the semiconductor substrate, for example. The dopants of the second conductivity type may cause the epitaxial layer to have the second conductivity type after activation of the dopants, for example. The epitaxial layer may have a minimum thickness of at least 2 μm (or e.g. at least 6 μm, or e.g. at least 8 μm) for example.

The dopants of the first conductivity type may be incorporated 730 into the second doping area of the anode doping region after forming the epitaxial layer. The second doping area may be located (wholly or partially) in the formed epitaxial layer, for example. The dopants of the first conductivity type may be incorporated 730 to form the second doping area at a surface of the epitaxial layer.

Optionally or alternatively, dopants of the first conductivity type may be incorporated simultaneously into at least one (surface) edge doping region (e.g. one or more edge doping regions, or e.g. a plurality of edge doping regions) located in an edge termination region of the semiconductor substrate during the first incorporation process or during the second incorporation process, for example.

A (maximum or average) vertical dimension (height) of the second doping area is smaller than a (maximum or average) vertical dimension (thickness) of the epitaxial layer. For example, a maximum of a dopant distribution profile (or a majority) of the dopants incorporated into the second doping area may lie at a smaller vertical depth in the epitaxial layer than the thickness of the epitaxial layer.

The semiconductor substrate and the epitaxial layer may be annealed 740 to form the anode doping region comprising the first doping area and the second doping area after incorporating 730 the dopants of the first conductivity type into the second doping area. The annealing 740 may cause the spreading (or expansion, or diffusion) of the first doping area and the second doping area to overlap to form a single (or unified or merged) anode doping region comprising the first conductivity type, for example.

The annealing 740 may also cause the spreading (or expansion or diffusion) of the edge doping regions comprising the first conductivity type located in the edge termination region of the semiconductor substrate, for example.

The first doping area (after annealing) may form a buried laterally extending portion of the anode doping region, for example. The second doping area (after annealing) may form a contact doping portion of the anode doping region, for example.

After annealing the semiconductor substrate and the epitaxial layer, the method 700 may further include forming an anode electrode structure 614 on the surface of the epitaxial layer portion of the semiconductor substrate above (or on) the active region of the semiconductor substrate. The method 700 may further include forming an electrically insulating (dielectric) structure on the surface of the epitaxial layer portion of the semiconductor substrate above (or on) the edge termination region of the semiconductor substrate.

After annealing, the aspect ratio between a maximum (or average) lateral dimension of the anode doping region and a maximum (or average) vertical dimension of the anode region may be at least 5:1 (or e.g. at least 7:1, or e.g. at least 10:1, or e.g. at least 15:1), for example.

In method 700, after a first masking doping level, a lowly doped semiconductor layer may be epitaxially deposited, and a further doping step mask level may be introduced. At least in the region of the subsequent anode, both doping regions may be connected by diffusion.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1 to 7) or below (FIG. 8).

FIG. 8 shows a schematic illustration of a diode device 800 according to an embodiment.

The diode device 800 comprises an anode doping region 101 arranged in a semiconductor substrate 102. The anode doping region 101 comprises a first conductivity type. The diode device 800 further comprises a second conductivity type contact doping region 103 comprising a second conductivity type. The second conductivity type contact doping region 103 is arranged at a surface 104 of the semiconductor substrate 102 and surrounded by the anode doping region 101. The anode doping region 101 comprises a buried non-depletable portion 105. At least part of the buried non-depletable portion 105 is located below the second conductivity type contact doping region 103 in the semiconductor substrate 102.

Due to the second conductivity type contact doping region 103 being arranged at a surface 104 of the semiconductor substrate 102, charge carriers (e.g. electrons) may flow through the second conductivity type contact doping region 103 to an anode electrode structure in the forward bias operation. These charge carriers (e.g. electrons) flowing through the second conductivity type contact doping region 103 do not lead to injection of holes. Thus, lower flooding charge in front of the anode, in comparison to the region in front of the cathode, may lead to a smoother switching behavior of the diode device. With increasing current densities, the density of electron currents may also increase and therefore, also the path voltage drop of the electrons on the way to the second conductivity type contact doping region 103. More holes may be injected, which may lead to an increase in the carrier flooding in the drift region, and to a limited increase of the forward voltage of the diode and diode losses. The diode device 800 is therefore able to combine a low carrier flooding in front of the anode with a higher robustness and surge current strength. The diode device 800 is more surge current resistant than other anode structures with the same carrier flooding, for example. Due to the buried non-depletable portion 105 of the anode doping region 101 being located below the second conductivity type contact doping region 103 in the semiconductor substrate 102, the buried non-depletable portion 105 shields out an electric field to the anode contact, for example. Due to it being non-depletable, it is not eliminated.

The anode doping region 101 of the diode device may include a first conductivity type contact doping portion which is located in the semiconductor substrate 102 at (e.g. directly adjacent to) a first surface 104 (e.g. a front surface) of the semiconductor substrate 102. At least part of the anode doping region 561 may be electrically connected to an anode electrode (metallization) structure located at (or on) the first surface 104 of the semiconductor substrate 102. For example, the anode electrode structure may be arranged (directly) adjacently to the anode doping region 101.

A cathode doping region of the diode device may be located in the semiconductor substrate 102 at (e.g. directly adjacent to) a second opposite surface a back surface) of the semiconductor substrate 102. The cathode doping region may be electrically connected to a cathode electrode structure located at (or on) the second (opposite) surface of the semiconductor substrate 102. For example, the cathode electrode structure may be arranged (directly) adjacently to the cathode doping region, More details and aspects are mentioned in connection with the embodiments described above or below. The embodiments shown in FIG. 8 may comprise one or more optional additional features corresponding to one or more aspects mentioned in connection with the proposed concept or one or more embodiments described above (e.g. FIGS. 1 to 7) or below.

Various examples relate to diode structures with surge current resistance and low anode emitter efficiency, for example. Various examples relate to diode structures with deep reaching anodes. Various examples relate to diode structures with deep reaching anodes, whereby the profile of the anode doping has a local maximum, which lies deeper than the characteristic length of the doping profile.

Aspects and features (e.g. the semiconductor substrate, the anode doping region, the diode structure, the first conductivity type, the second conductivity type, the buried non-depletable portion, the second conductivity type contact doping region, the depletable portion, the field stop doping portion, the buried recombination portion, the cathode doping region, the drift region, the edge doping portion, the edge termination region, the active region) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
    an anode doping region of a diode structure arranged in a semiconductor substrate, the anode doping region having a first conductivity type; and
    a second conductivity type contact doping region having a second conductivity type, the second conductivity type contact doping region being arranged at a surface of the semiconductor substrate and surrounded in the semiconductor substrate by the anode doping region,
    wherein the anode doping region comprises a buried non-depletable portion,
    wherein at least part of the buried non-depletable portion is located below the second conductivity type contact doping region in the semiconductor substrate,
    wherein the buried non-depletable portion is completely surrounded by semiconductor material of the semiconductor substrate,
    wherein a drift region of the diode structure is arranged between the anode doping region and a second surface of the semiconductor substrate,
    wherein the drift region comprises the second conductivity type,
    wherein at least a portion of the anode doping region is located between the second conductivity type contact doping region and the drift region.

2. The semiconductor device of claim 1, wherein the anode doping region and the second conductivity type contact doping region are electrically connected to an anode electrode structure located at the surface of the semiconductor substrate.

3. The semiconductor device of claim 1, wherein the buried non-depletable portion of the anode doping region laterally overlaps the whole of the second conductivity type contact doping region in a top view of the semiconductor device.

4. The semiconductor device of claim 1, further comprising:
    a cathode doping region of the diode structure arranged at the second surface of the semiconductor substrate,
    wherein the cathode doping region comprises the second conductivity type,
    wherein a dopant concentration of the cathode doping region is at least ten times larger than a dopant concentration of the drift region of the diode structure.

5. The semiconductor device of claim 1, wherein the diode structure has a blocking voltage of at least 100 V.

6. The semiconductor device of claim 1, wherein the buried non-depletable portion is configured to shield out the electric field to the second conductivity type contact doping region in reverse operation of the semiconductor device, wherein a doping of the buried non-depletable portion is so high that the buried non-depletable portion cannot be eliminated in the reverse operation, and wherein despite the presence of the second conductivity type contact doping region no increased reverse current flows in the reverse operation.

7. The semiconductor device of claim 1, wherein the anode doping region further comprises a buried recombination portion, and wherein the buried recombination portion comprises a higher average concentration of recombination centers than the drift region of the diode structure.

8. The semiconductor device of claim 7, wherein at least part of the buried recombination portion of the anode doping region is located vertically between the second conductivity type contact doping region and the buried non-depletable portion of the anode doping region.

9. The semiconductor device of claim 1, wherein the anode doping region comprises a first conductivity type contact doping portion located laterally adjacently to the second conductivity type contact doping region at the surface of the semiconductor substrate.

10. The semiconductor device of claim 9, wherein the first conductivity type contact doping portion of the anode doping region is located between two second conductivity type contact doping regions, and wherein a maximum lateral width of the first conductivity type contact doping portion between the two second conductivity type contact doping regions is less than 5 μm.

11. The semiconductor device of claim 9, wherein the second conductivity type contact doping region is located between two first conductivity type contact doping portions of the anode doping region, and wherein a maximum lateral width of the second conductivity type contact doping region between the two first conductivity type contact doping portions is less than 5 μm.

12. The semiconductor device of claim 1, wherein the buried non-depletable portion of the anode doping region is embedded in a depletable portion of the anode doping region.

13. The semiconductor device of claim 12, wherein at least part of the depletable portion of the anode doping region is located between the buried non-depletable portion of the anode doping region and the drift region of the diode structure.

14. The semiconductor device of claim 12, wherein a dopant concentration of the buried non-depletable portion of the anode doping region is at least five times larger than a dopant concentration of the depletable portion of the anode doping region.

15. A method for forming a semiconductor device, the method comprising:
- arranging a decelerating mask layer at a surface of a semiconductor substrate; and
- incorporating dopants into the semiconductor substrate through the decelerating mask, to simultaneously form at least one first conductivity type contact doping portion of an anode doping region located at the surface of the semiconductor substrate at a masked region of the semiconductor substrate and at least one buried non-depletable portion of the anode doping region located in the semiconductor substrate at unmasked regions of the semiconductor substrate.

16. A diode device, comprising:
- an anode doping region arranged in a semiconductor substrate, the anode doping region having a first conductivity type;
- a second conductivity type contact doping region having a second conductivity type, the second conductivity type contact doping region being arranged at a first surface of the semiconductor substrate and surrounded in the semiconductor substrate by the anode doping region; and
- a cathode doping region of the diode structure arranged at a second surface of the semiconductor substrate,
- wherein the anode doping region comprises a buried non-depletable portion,
- wherein at least part of the buried non-depletable portion is located below the second conductivity type contact doping region in the semiconductor substrate,
- wherein the cathode doping region comprises the second conductivity type,
- wherein a dopant concentration of the cathode doping region is at least ten times larger than a dopant concentration of a drift region of the diode structure.

17. A method for forming a semiconductor device, the method comprising:
- incorporating, by a first incorporation process, dopants of a first conductivity type to form a first doping area of an anode doping region to be formed in proximity to a surface of a semiconductor substrate;
- forming an epitaxial layer on the surface of the semiconductor substrate;
- incorporating, by a second incorporation process, dopants of the first conductivity type to form a second doping area of the anode doping region in proximity to a surface of the epitaxial layer, wherein a dopant concentration of the dopants incorporated into the second doping area is larger than a dopant concentration of dopants of the second conductivity type in the epitaxial layer, and wherein a vertical dimension of the second doping area is smaller than a vertical dimension of the epitaxial layer; and
- annealing the semiconductor substrate and the epitaxial layer to enlarge the first doping area and the second doping area by diffusion of dopants to form a merged anode doping region extending from the surface of the epitaxial layer vertically deeper than the first doping area, wherein an aspect ratio between a maximum lateral dimension of the anode doping region and a maximum vertical dimension of the anode doping region is at least 5:1.

18. The method of claim 17, wherein dopants causing the first conductivity type are incorporated simultaneously into at least one edge doping region located in an edge termination region of the semiconductor substrate during the first incorporation process or during the second incorporation process.

* * * * *